(12) United States Patent
Nottola et al.

(10) Patent No.: US 7,871,760 B2
(45) Date of Patent: Jan. 18, 2011

(54) METHOD TO FABRICATE A REDIRECTING MIRROR IN OPTICAL WAVEGUIDE DEVICES

(75) Inventors: Alessandro Nottola, Milan (IT); Umberto Colombo, Milan (IT); Giorgio Cataldo Mutinati, Milan (IT); Stefano Sardo, Milan (IT)

(73) Assignee: PGT Photonics S.p.A., Milan (IT)

( * ) Notice: Subject to any disclaimer, the term of this patent is extended or adjusted under 35 U.S.C. 154(b) by 756 days.

(21) Appl. No.: 11/886,770

(22) PCT Filed: Mar. 31, 2005

(86) PCT No.: PCT/EP2005/003391

§ 371 (c)(1),
(2), (4) Date: Sep. 20, 2007

(87) PCT Pub. No.: WO2006/102917

PCT Pub. Date: Oct. 5, 2006

(65) Prior Publication Data

US 2009/0020499 A1 Jan. 22, 2009

(51) Int. Cl.
*G02B 6/42* (2006.01)
*G03F 7/20* (2006.01)
(52) U.S. Cl. .......................... 430/321; 430/296; 216/24
(58) Field of Classification Search ........................ None
See application file for complete search history.

(56) References Cited

U.S. PATENT DOCUMENTS 4,904,036 A 2/1990 Blonder (Continued)

FOREIGN PATENT DOCUMENTS

EP 0 651 266 A2 5/1995

(Continued)

OTHER PUBLICATIONS

Waits, C. M. et al., "Investigation of Gray-Scale Technology for Large Area 3D Silicon MEMS Structures," J. Micromech. Microeng., vol. 13, pp. 170-177, (2003).

(Continued)

*Primary Examiner*—John A. McPherson
(74) *Attorney, Agent, or Firm*—Finnegan, Henderson, Farabow, Garrett & Dunner LLP

(57) ABSTRACT

A method of fabricating a turning mirror for an optical device includes the steps of depositing on a substrate, which defines a plane in which an optical signal propagates in a propagating direction, a photoresist layer sensitive to electrons and to UV radiation. The material in which the photoresist layer is formed, has a contrast not larger than 3. A first portion of the photoresist layer is exposed to an electron beam, wherein the electron dose of the electron beam exposure is varied within the first portion according to a selected pattern, and wherein the electron does to which a given region in the photoresist is exposed, depends on the resulting photoresist height in the given region after development. A second portion of the photoresist layer is exposed to UV radiation; the first and the second portions are overlapped at least in a third portion. The photoresist layer is developed so as to form in the third portion of the photoresist layer exposed to both electron beam and to UV radiation a first surface having an angle relative to the propagating direction. The substrate and the photoresist are etched so that a second angled surface is formed in the substrate in correspondence to the third portion. The second surface forms an angle with the propagating direction.

24 Claims, 14 Drawing Sheets

U.S. PATENT DOCUMENTS

| | | | |
|---|---|---|---|
| 5,135,605 | A | 8/1992 | Blonder et al. |
| 5,182,787 | A | 1/1993 | Blonder et al. |
| 6,235,450 | B1 | 5/2001 | Nakasuji |
| 2003/0108818 | A1* | 6/2003 | Livesay et al. ............... 430/296 |
| 2003/0155327 | A1* | 8/2003 | Nakata ......................... 216/24 |

FOREIGN PATENT DOCUMENTS

| | | |
|---|---|---|
| JP | 6-265738 | 9/1994 |
| WO | WO 03/071587 A1 | 8/2003 |

OTHER PUBLICATIONS

Däschner, W. et al., "Cost-Effective Mass Fabrication of Multilevel Diffractive Optical Elements by Use of s Single Optical Exposure with a Gray-Scale Mask on High Energy Beam-Sensitive Glass," Applied Optics, vol. 36, No. 20, pp. 4675-4680, (1997).

Kalus, M. et al ., "Free 3D Shaping with Gray-Tone Lithography and Multidose E-Beam Writing," Microelectronic Engineering 41/42, pp. 461-464, (1998).

"Electron-Solid Interactions," SPIE Handbook of Microlithography, Micromachining and Microfabrication, vol. 1: Microlithography, Section 2.3, pp. 1-3, (2004).

"Proximity Effect", SPIE Handbook of Microlithography, Micromachining and Microfabrication, vol. 1: Microlithography, Section 2.4, pp. 1-3, (2004).

"Data Preparation", SPIE Handbook of Microlithography, Micromachining and Microfabrication, vol. 1: Microlithography, Section 2.6, pp. 1-6, (2004).

"Resists", SPIE Handbook of Microlithography, Micromachining and Microfabrication, vol. 1: Microlithography, Section 2.7, pp. 1-11, (2004).

Kudryashov, V. et al., "Grey Scale Sturctures Formation in SU-8 with e-beam and UV," Microelectronic Engineering 67-68, pp. 306-311, (2003).

Tiberio, R. C. et al., "Fabrication of Electron Beam Generated, Chirped Phase Mask (1070.11-1070.66 nm) for Fiber Bragg Grating Dispersion Compensator," J. Vac. Sci. Technol. B, vol. 16, No. 6, pp. 3237-3240, (1998).

Albert, J. et al., "Minimization of Phase Errors in Long Fiber Bragg Grating Phase Masks Made Using Electron Beam Lithography", IEEE Photonics Technology Letters, vol. 8, No. 10, pp. 1334-1336, (1996).

Wong, W. H. et al., "Exposure Characteristics and Three-Dimensional Profiling of SU8C Resist Using Electron Beam Lithography," J. Vac. Sci. Technol. B, vol. 19, No. 3, pp. 732-735, (May/Jun. 2001).

Tedesco, S. et al., "Resist Processes for Hybrid (Electron-Beam/ Deep Ultraviolet) Lithography," J. Vac. Sci. Technol. B, vol. 16, No. 6, pp. 3676-3683, (Nov./Dec. 1998).

* cited by examiner

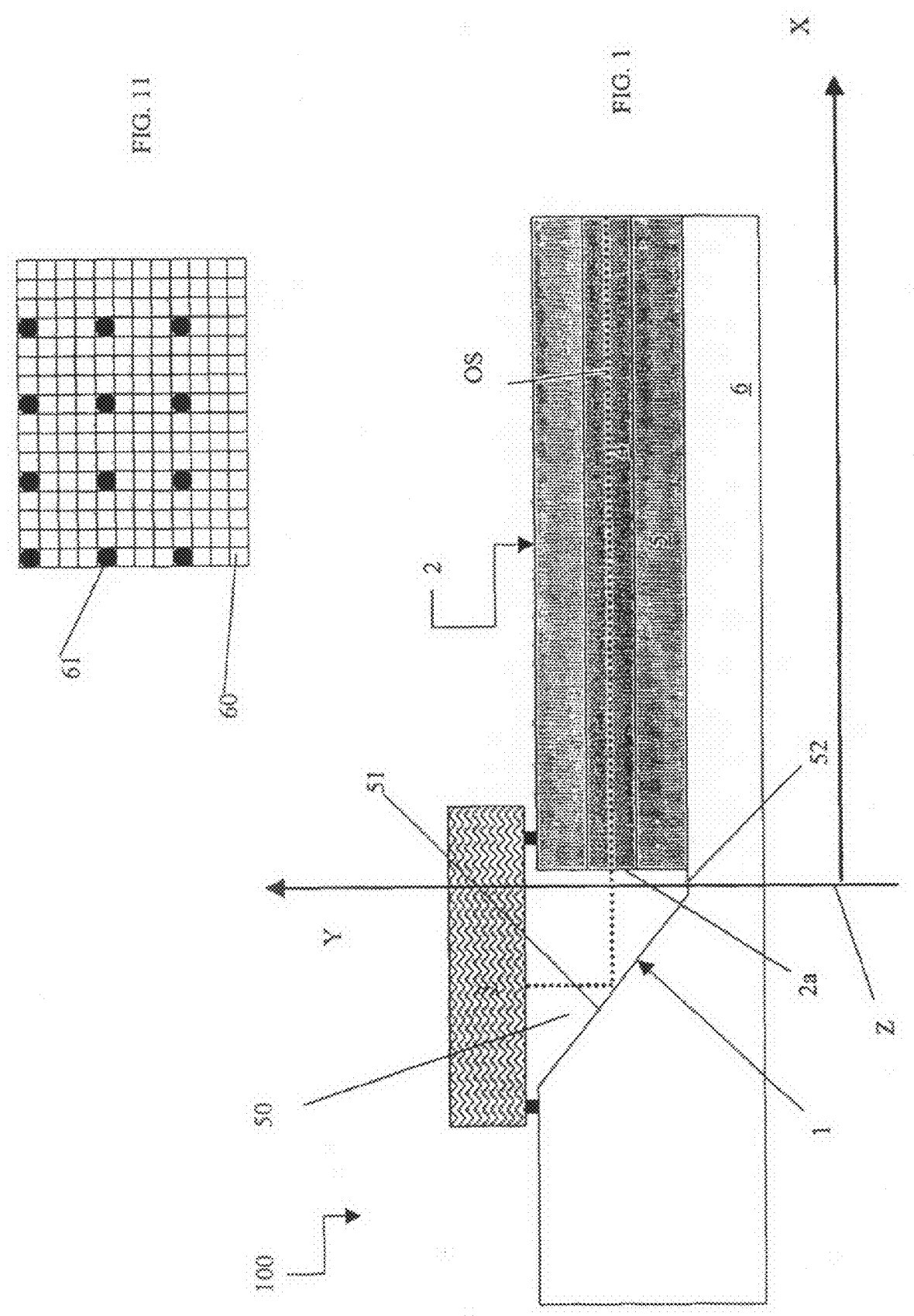

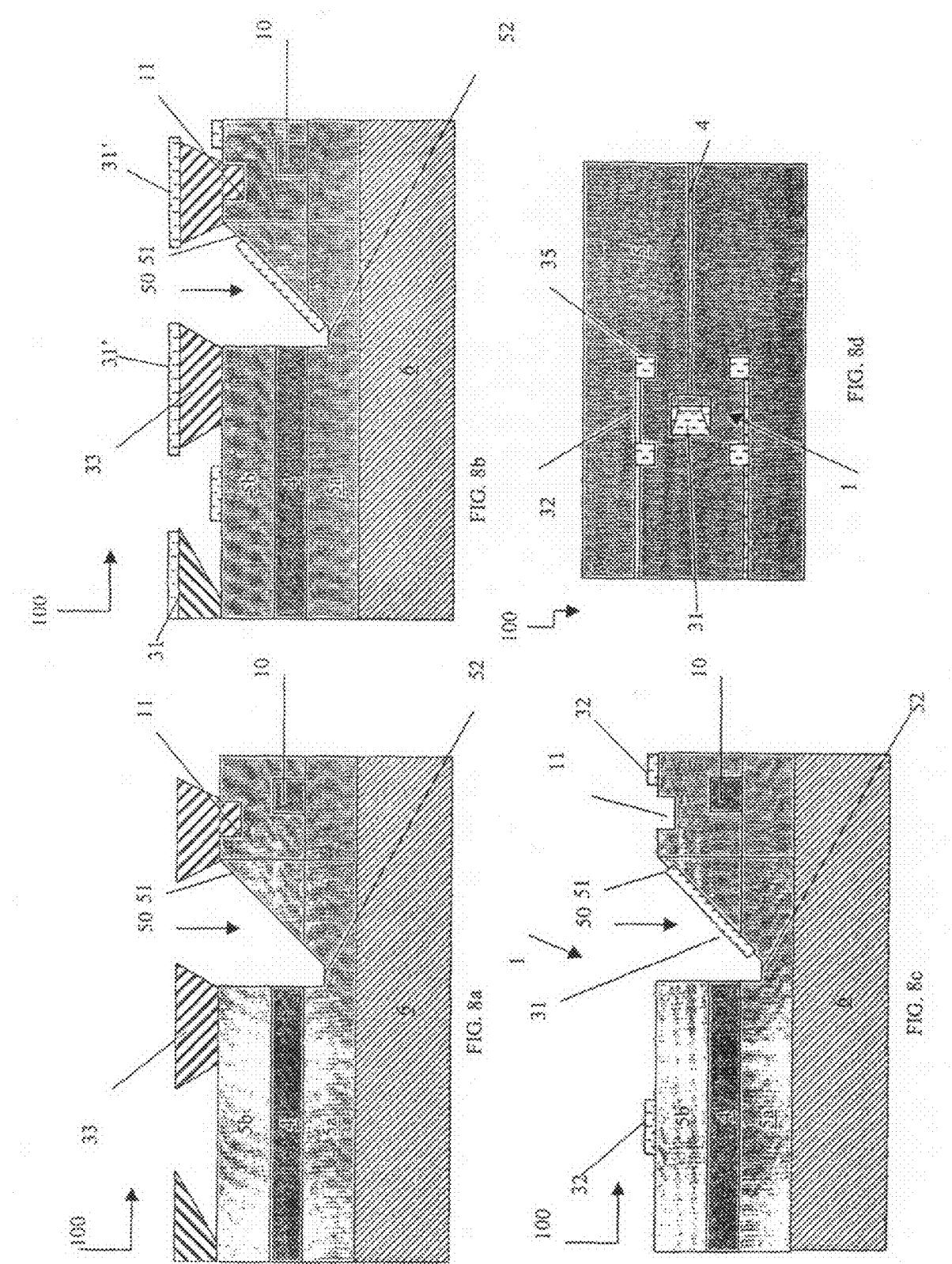

12
METHOD TO FABRICATE A REDIRECTING MIRROR IN OPTICAL WAVEGUIDE DEVICES

CROSS REFERENCE TO RELATED APPLICATION

This application is a national phase application based on PCT/EP2005/003391, filed Mar. 31, 2005, the content of which is incorporated herein by reference.

TECHNICAL FIELD

The present invention relates to a method to fabricate a turning mirror for optical devices, in particular for optoelectronic integrated circuits. Turning mirrors are capable of directing optical signals into and/or out planar waveguides.

TECHNOLOGICAL BACKGROUND

A turning mirror is a structure that is capable of coupling an optical signal, for example entering or coming out of an optical waveguide, with an optical transmitter or receiver, such as a laser diode or a photodetector. Generally, the two devices, i.e. the waveguide and the optical transmitter/receiver, do not lie on the same plane and therefore the turning mirror redirects the optical signal, reflecting the same of the angle needed. As an example, the mirror can make an abrupt 90° change of the direction of the light propagating in the optical waveguide such as to deflect the light toward the receiver.

Turning mirrors are extremely useful in integrated optical devices for directly processing optical signals; indeed such devices have become of greater importance as optical fiber communications are more and more widely used. Typical optical circuits applications require passive as well as active devices. Passive devices are formed within conventional silica optical circuits, whilst active devices, for example, are optical devices detectors and transmitters as well as modulators. The two different devices are interconnected through optical waveguides. As said, the turning mirror reflects signals coming from the waveguide linked to a passive device to the active device and vice-versa.

A general description of possible configurations and applications of turning mirrors in optoelectronic integrated circuits is reported for example in the U.S. Pat. No. 4,904,036 in the name of American Telephone and Telegraph Company and AT&T Bell Laboratories.

In U.S. Pat. Nos. 5,135,605 and 5,182,787 in the name of AT&T Bell Laboratories, a method to form an optical waveguide structure comprising a turning mirror realized by etching, and a method to form the same, are disclosed. In these patents, the mirror is realized employing a selective wet etching process to make a cavity in a waveguide, thus intercepting the light path propagating by the waveguide. Preferably, the cavity is made to be asymmetric with the side of the cavity remote from the waveguide sloping at typically 45° angle. The reflecting site of the cavity could be metallized to improve the reflectivity. The angle formed by the mirror depends on the etching process parameters.

Applicants have noted that this etching method to fabricate turning mirrors has a limited flexibility, in particular it is not suitable in case a plurality of turning mirrors having different angles is desired to be obtained on the same optical device.

Another turning mirror fabricating process is described in JP 6265738 in the name of Nippon Telegr & Teleph, in which many reflecting mirrors are formed simultaneously in optical waveguides. A photoresist is patterned using a photomask partly having mask patterns of the size or density of apertures gradually increasing in the longitudinal direction of optical waveguides. This patterned photoresist with sloped structures is used as an etching mask and the sloped structure is etched in the underlying layer film.

The method of resist exposure used in the process outlined in the above mentioned Japanese document is generally known as gray-tone or gray-scale lithography. Gray-scale lithography utilizes locally modulated exposure doses to develop the desired three-dimensional (3D) structure in the photoresist. Differential exposure doses lead to multiple depths of exposed photoresist across the surface. This is due to the ultraviolet light energy being absorbed by the photoactive compound as it travels in the depth of the photoresist. From the differential exposure doses, a gradient height photoresist structure corresponding to the designed silicon structure will remain once developed.

In "Investigation of gray-scale technology for large area 3D silicon MEMS structures", written by C. M. Waits et al., published in J. Micromech. Microeng. 13 (2003), pages 170-177, it is shown that micromachining arbitrary 3D silicon structures for micro-electromechanical systems can be accomplished using gray-scale lithography along with dry anisotropic etching. Two important design limitations of gray-scale lithography have been investigated: the minimum usable pixel size and maximum usable pitch size. The mask used in the experiments performed in this article is a chrome-on-glass mask.

In "Cost-effective mass fabrication of multilevel diffractive optical elements by use of a single optical exposure with a gray-scale mask on high energy beam-sensitive glass", written by W. Däschner et al., published in Applied Optics, Vol. 36 no 20 (1997), pages 4675-4680, a method for reproducing diffractive optical elements in quantity is described. A single e-beam writing step without any resist processing generates the mask. This single mask then contains all the necessary information previously contained in a set of five binary masks. In particular, HEBS glass is used to generate the gray-scale mask. This mask is then used in a contact aligner. The translation of electron dosage that was represented in the gray-scale mask by the variation of the optical density into a surface profile in the photoresist occurs. The photoresist chosen and used in these experiments is a positive novolac-resist.

Applicants note that gray-tone optical lithography for the definition of resist mask 3D profiles can permit a high flexibility. By using this technique, a wide range of 3D shapes, such as cavities with angled surfaces, can be achieved on a single optoelectronic integrated circuit. Unfortunately, grey-scale masks on optical photomasks, such as high-energy beam-sensitive glass (HEBS), are complicated to realize and generally very expensive.

An alternative method to obtain 3D shapes is to use variable-dose (or multi-dose) electron-beam lithography for the definition of the resist mask profile. The variable-dose e-beam lithography applied to the realization of complex structures is a topic addressed by several authors.

In "Free 3D Shaping with Gray-Tone Lithography and Multidose E-Beam Writing", written by M. Kalus et al., published in Microelectronic Engineering 41/42 (1998), pages 461-464, 3D structures are realized by gray-tone lithography and directly by e-beam writing in a multiple dose regime. In particular, multidose e-beam writing assigns each element of a pattern, where a different resist height is proposed, to a precalculated local dose. The entire pattern is therefore split into layers which represent equal heights (like contour lines). A program transfers the three-dimensional design into a twodimensional pattern. The correlation between the height representing layers and the local dose numbers is calculated. A 2 µm thick PMMA layer developed by a methyl-isobutyl-ketone ethanol 2:1 mixture for 60 s revealed a contrast of about y=4.5.

European patent application n. 0651266 in the name of AT&T Corp. discloses a method of forming arbitrary angle mirrors in substrates. An erodible material, such as a photoresist, is applied to a substrate at a site and is exposed to radiation at that site which has a linear variation in energy at the surface of the erodible material. Due to this variation in exposure energy, a taper results in the erodible material after development. The tapered region is then etched in a manner which etches both the erodible material and the underlying substrate. In an embodiment of the invention, the tapered surface is obtained using e-beam lithography. A suitable programmed e-beam writer is scanned along the width of the intended grooved region. A number of scanning passes are made across the width of the region, where, after each pass, the beam is indexed along the length of the intended growth region. In this manner the full area of the intended growth region is sequentially exposed. As the e-beam is indexed along the length of the region, the energy of the e-beam is varied as required to alter the exposure depth to provide the desired taper.

From the cited prior art, it is shown that the fabrication of a turning mirror structure making use of multi-dose e-beam lithography to define the resist mask mirror profile and of reactive ion etching to transfer the mirror profile into the underlying substrate is possible. These steps however put some constraints on the e-beam process parameters. Applicants have noted that the resist thickness deposited on the substrate must be sufficiently high to allow the subsequent substrate etching, said thickness depending also on the selectivity during etching (with selectivity it is meant the etching rate ratio between the two materials constituting the mask and the substrate). Provided that for the two materials there is some etching recipe giving an optimal result and a maximum selectivity, it also exists a minimum resist thickness required for that recipe and for the substrate thickness to etch. Typically, the resists commonly used for e-beam lithography can reach thickness of only a few microns.

In the "*SPIE Handbook of Microlithography, Micromachining and Microfabrication*", Volume I: Microlithography, Chapter 2.7.2.5 "Photoresists as e-beam resist", it is written that some photoresists can be exposed by e-beam, although the chemistry is quite different from that of UV exposure. Because electrons cause both positive exposure and cross-linking at the same time, a photoresist film exposed with electrons must be developed with a "strong" developer for "positive" behavior, or, the same film can be blanket-exposed with UV light and then developed in a "weak" developer for "negative" behavior. An example is given: photoresist AZ5206 has a contrast of 4.

In "*Exposure characteristics and three-dimensional profiling of SU8C resist using electron beam lithography*", written by W. H. Wong et al, and published in J. Vac. Sci. Technol. B 19(3) (2001), pages 732-735, the properties of a new type of chemically amplified resist, SU8C, are evaluated for electron beam lithography. The resist is a modification of the ultraviolet sensitive negative epoxy SU8. Experimental results show that sensitivity of SU8C is one of the highest among the different kinds of commercially available resists. The contrast, y, can be adjusted to near unity by adjusting the postannealing time. Vertical resolution down to 20 nm has been obtained.

In "*Gray scale structures formation in SU-8 with e-beam and UV*", written by V. Kudryashov et al. and published in Microelectronic Engineering 67-68 (2003), pages 306-311, an experimental study of the possibility to fabricate grey scale optical elements and 3D structures in SU-8 resist was carried out. It was found that the negative CAR SU-8 has a contrast smaller than 1 for PEB at temperature of 20-45° C. and sensitivity of the order of 1 µC/cm3 to 365-nm UV radiation. Continuous surface relief 3D structures formation in SU-8 by UV exposure was demonstrated both with true grey scale photomasks made with a high-energy beam sensitive glass and binary coded grey scale photomasks. A new technology for 3D self supporting structure formation in thick SU-8 resist layer was suggested, the techniques includes anchor elements exposure with UV for the whole resist thickness and a subsequent exposure of self-supporting fine structures in the upper resist layer only with a low-energy electron beam. International patent application WO 03/071587, in the name of University of Delaware, shows a process for making photonic crystal circuit and a photonic crystal circuit consisting of regularly-distributed holes in a high index dielectric material, and controllably-placed defects within this lattice, creating waveguides, cavities, etc for photonic devices. The process is based upon the finding that some positive ultraviolet (UV) photoresists are electron beam sensitive and behave like negative electron beam photoresists. This permits creation of photonic crystal circuits using a combination of electron beam and UV exposures. As a result, the process combines the best features of the two exposure methods: the high speed of UV exposure and the high resolution and control of electron beam exposure. As an example of suitable photoresist for the method disclosed in this patent, the AZ 5200 class photoresist is mentioned.

Applicants have noted that photoresists belonging to the AZ 5200 class have generally a high contrast, normally above 3. As an example, the AZ5206 photoresist has a contrast equal to 4 as indicated in the article written by W. H. Wong and quoted above (see page 733 of the article in issue).

Stitching errors are a common problem in e-beam lithography. An e-beam writing field (or exposure field) is the maximum deflection allowable for the scanning electron beam. A pattern with less than the exposure field can be written just deflecting the beam, whereas a pattern exceeding the exposure field must be written moving the stage where the substrate is mounted and by stitching the exposure fields together. This method is the origin of the so-called stitching error, which is due to the stage positioning accuracy limited by mechanical precision and which is not perfectly corrected by Beam Error Feedback (BEF) methods.

In "*Fabrication of electron beam generated, chirped phase mask (1070.11-1070.66 nm) for fiber Bragg grating dispersion compensator*" written by R. C. Tiberio et al., published in J. Vac. Sci. Technol. B 16(6) (1998) pages 3237-3240, the fabrication of a chirped, phase mask that was used to create a fiber Bragg grating (FBG) device for the compensation of chromatic dispersion in longhaul optical transmission networks is reported. Special attention has been paid to minimize any stitching error and exposure artifacts. This was done by using overlapping fields in a "voting" method. As a result, each grating line is exposed by the accumulation of three overlapping exposures at ⅓ dose. This translates any abrupt stitching errors into a small but uniform change in the line-to-space ratio of the grating.

In "*Minimization of Phase Errors in Long Fiber Bragg Grating Phase Masks Made Using Electron Beam Lithography*" written by J. Albert et al., published in Photonics Technology Letters, Vol. 8, no 10 (1996), pages 1334-1336, it is reported that centimeter-long fiber Bragg grating phase masks having several thousand periods are fabricated using electron beam lithography and require the stitching together of many electron beam writing fields. Among other, a technique to minimize the effect of phase errors arising from the stitching process is used. This technique consists of spreading the stitching error over the length of the mask by overlapping the electron-beam writing fields. The entire phase-mask is overwritten several times. For each "pass", a different but constant field size is chosen. The field boundaries are chosen so that those of one pass do not overlap those of any other pass, thereby averaging out the stitching errors. The electron dose of each pass is adjusted so that the exposure dose of each grating line is optimal.

SUMMARY OF THE INVENTION

The present invention relates to a method for the fabrication of turning mirrors, preferably turning mirrors for optoelectronic integrated circuits.

These mirrors generally comprise reflective surfaces positioned near an end of a waveguide and close to an active device (such as optical transmitters or receivers) to enable an exchange of optical signals between the active device and the waveguide. However any other configuration can be envisaged, in all of which the turning mirror redirects optical signals which reflect on its reflective surface from a first incoming X direction to a second direction Y.

In the present invention, the turning mirror is realized etching a cavity into a substrate, which defines an XZ plane. In this plane, an optical signal propagating direction X is also defined. One of the surfaces of the etched cavity has the form of an angled surface with respect to the plane defined by the substrate. This surface is the reflecting surface of the turning mirror. In other words, the turning mirror is realized etching a wedge-shaped tapered region on a substrate.

Preferably, but not necessary, the cavity is etched on the upper surface of an optical waveguide structure. In more detail, a lower cladding layer may be deposited over a first substrate. On this layer, a core layer is deposited and subsequently etched according to a preferred pattern. The core has a distal end. The core is thus covered and buried by the deposition of an additional upper cladding layer. Optical signals may propagate into the waveguide along the propagating direction X. The etched cavity is therefore formed etching the upper surface of the upper cladding layer in a location such that the so-formed reflective surface is positioned opposite the distal end surface of the core of the waveguide.

In the following, therefore, the generic term "substrate" may also mean the cladding layer of a waveguide structure.

The cavity is to be etched sufficiently deep to intercept the path of the light propagating in the optical waveguide (i.e. at least as deep as the core layer level). Therefore, turning mirrors fabrication may require in several applications a deep etching in the substrate, i.e. etching deeper than 10 µm. One of the main goals of the present invention is to provide a method for the realization of turning mirrors deeply etched in a substrate which at the same time gives a good control over the mirror angle (i.e. the angle formed between the etched reflective surface and the plane of the substrate—the XZ plane) and a good accuracy (preferably smaller than ±2.5°). In addition, the method of the invention does not require expensive graytone photomasks.

In order to obtain a deep etching on a substrate, generally the deposition of a thick resist layer is needed, in order to form a suitable mask to protect the underlying layer during the etching step. Applicants have observed that resists commonly used for e-beam lithography are generally rather thin (of the order of few microns) and thus not suitable for deep etching of underlying structures. Applicants have performed experiments to apply the SU8 resist in a process for the formation of a turning mirror. The experiments, however, produced poor results. In particular, it was found a limited control over the angle of the inclined plane, a large surface roughness on the lower resist levels, the presence of resist "scum" (i.e. resist residuals) in the region surrounding the structure of interest, and lack of verticality on nominal 90° sidewalls. Therefore, the SU8 resist has been considered by Applicants not suitable for the realization of turning mirrors having the desired characteristics.

On the other hand, a particular selection of the resist to be patterned and to be used afterwards as a mask during the subsequent etching of the substrate, and of the patterning technique, gives the desired result.

According to the method of the invention, a suitable photoresist is deposited over the substrate to be etched, and it is patterned using a double exposure: a multidose electron beam exposure and an ultraviolet (UV) exposure.

The photoresist used in the "double exposure" step of the method of the invention is a photoresist which is sensitive both to electron and to UV radiation. In particular, this photoresist is preferably an UV positive and e-beam negative resist. In case of an e-beam negative, UV positive resist, when the electron exposure is followed by an UV exposure (or vice-versa, the electron exposure may follow the UV exposure), regions of the photoresist 12 which have been exposed to a determined electron dose and to a certain UV light energy, will be left unmodified by the development (behaving as an e-beam negative tone resist), whilst in regions where the resist has not been exposed to an electron dose but has been exposed to UV light, it will be removed by the development (behaving as an UV positive tone resist).

Preferably, the thickness of the deposited resist is above 7.5 µm, more preferably between 7.5 µm and 10 µm. However the selected thickness of the resist depends, among other, on the etching depth to be achieved.

The e-beam exposure of the method of the invention is carried out using a multidose electron beam lithography technique, adapted to the double exposure of the present invention.

In the standard multidose electron-beam technique, a variable height of the resist layer can be achieved after development by exposing the resist to a variable electron dose. In multidose electron-beam writing, each element of a 3D structure (in the present case a wedge-like structure), which is characterised by a given height, corresponds to a given local dose. Thus, the correlation between the height of a resist layer and the local dose can be calculated. Typically, the e-beam exposure patterns used are arrays of square pixels, each with a given e-beam dose, which is so as to provide the appropriate resist height upon development. The e-beam writer is scanned along the width of the intended patterned region. The electron dose of the beam is varied as required to vary the resist height so as to provide the desired taper after development.

In particular, in the present invention the electron-beam dose calculated for each pixel of the pattern takes into account the fact that after the e-beam exposure, an UV exposure follows. Preferably, for a selected e-beam and UV sensitive resist, the response to the electron dose is firstly measured, i.e. the resist thickness remaining after e-beam exposure, UV exposure and development vs. the electron dose provided during e-beam exposure is measured. In this way, the electron dose to be given to each point of the pattern is calculated in order to obtain the desired tapered region on the resist. The contrast (i.e. the slope of the linear portion of the falling section of the curve "film thickness after development versus exposure dose" of a photoresist) of the photoresist is a relevant parameter in the selection of a photoresist suitable for e-beam gray-tone. Indeed, in photoresists having a relatively high contrast (i.e. higher than about 3), small variations in exposure dose have a large effect on the resulting pattern shapes (i.e. on the resulting resist height), thus making difficult to control the resist profile.

The contrast of a positive resist can be defined as follows: if $D_1$ is the largest e-beam dose at which no resist is lost and if $D_2$ is the e-beam dose at which all of the resist is lost, then the contrast of the resist is defined as $$\gamma = \left| \log\left(\frac{D_2}{D_1}\right)^{-1} \right|.$$

For a negative resist, the contrast $\gamma$ is defined in the same way, but the definitions of $D_1$ and $D_2$ are the opposite, namely $D_1$ is the minimum e-beam dose under which all the resist is removed, and $D_2$ is the dose above which no resist is removed. A relatively small resist contrast implies a relatively slow thickness variation with dose. Such a property of the resist is important to accurately control the remaining thickness of the photoresist after UV exposure and development. Preferably, the photoresist of the present invention is chosen so as to have a contrast smaller than 3, and more preferably not larger than 2 (a preferred range being between 1 and 2), and even more preferably around 1. After the e-beam exposure of a first region of a photoresist, a UV exposure of a second region of the photoresist follows, wherein the first and the second region at least partially overlap.

After this exposure, a development step follows and thus a first tapered region having an angled surface with respect to the substrate plane is formed on the resist.

This resist having this first tapered region is used afterwards as a mask during the etching process of the substrate and thus the first tapered region is "transferred" to the underlying substrate, to form a second tapered region and a second angled surface therein. In the etching step, a Reactive Ion Etching is preferably used. A cavity including a second angled surface, which forms the reflecting mirror according to the method of the invention, is thus formed in the substrate.

Preferably, the selectivity between the photoresist and the substrate is selected above 2:1, more preferably within the range 2:1÷3:1.

Preferably, the etched substrate comprises silicon based material.

Additionally, preferably the photoresist has a resolution (i.e., the minimal lateral dimension of a structure formed after development, which can be defined in the resist with accuracy) not larger than 1.5 µm and typically of about 1 µm.

A preferred example of an e-beam negative and UV positive suitable resist is SPR®220 made by Shipley Company L.L.C.

An additional preferred step of the method of the present invention is a reflective layer deposition over the etched angled surface of the turning mirror so as to increase the reflectivity of the surface itself. Therefore, according to a preferred embodiment of the invention, a metallic layer is deposited over the mirror surface.

Applicants have observed that it is preferred to limit the surface roughness of the first angled surface realized in the photoresist, so that the roughness of the etched surface of the turning mirror (for the realization of which the developed photoresist as an etching mask is used) is also limited. Furthermore, by decreasing the surface roughness of the surface of the photoresist, a better angle control is obtained.

Applicants have found that there are mainly two sources of roughness. The first source is a physical one: the photoresist interactions with the e-beam and development give origin to a granular or "porous" structure. The typical dimension of these "sub-features" depends on several factors, e.g. resist type and thickness, development dilution and duration and the considered depth in the resist.

Applicants have found that for this source of roughness also the UV exposure time/energy of the UV exposure step of the method of the invention above outlined are important parameters.

A second roughness source depends on the aberrations/stitching of the exposure sub-fields during the electron beam exposure step.

The e-beam sub-fields are partitions of the main writing field (the maximum deflection allowable for the scanning electron beam). E-beam calibrations are performed over each sub-field, besides being performed over the main exposure field, in order to obtain a greater precision in writing. Applicants have noted that residual aberrations or misplacements of the sub-fields may give origin to relatively small dose variations at the sub-field edges, and hence to undesired extra-features in the resist at sub-µm or µm scale, depending on the process conditions.

More specifically, applicants have observed that, where a relatively high resist thickness is to be used for the creation of 3D structures (typically of several tens of microns), the effect of the mentioned dose variations at the sub-field edges gives rise to the formation of "grooves" on the resist surface. The typical width of said grooves is observed to increase with the depth in the resist due to the e-beam spreading, and can be for example of the order of 1÷2 µm for resists of more than 10 µm thick.

In order to reduce this source of roughness, a preferred additional step of the invention is used. Therefore, according to this step, the pattern to be realized in the first portion of the photoresist is exposed in multiple consecutive exposures (referred to as n-exposures or sub-step exposures), where the resist surface to be exposed is shifted with respect to the writing field, so that in the sub-field edges of a sub-step exposure do not coincide with the sub-field edges of the previous n-exposure. In other words, the sub-field boundaries (or edges) are chosen so that those of one sub-step exposure do not overlap those of a subsequent sub-step exposure. The electron dose of each n-exposure is reduced so that the total dose is obtained at the end of all exposures. The preferred number n of successive sub-step exposures at 1/n of the original dose depends mainly on the size of the sub-fields (which generally depends on the electron beam equipment used) and on the selected shift between writing fields.

This multiple exposure has been found to considerably reduce the roughness of the resist sloped surface.

BRIEF DESCRIPTION OF THE DRAWINGS

Further features and advantages of a method to fabricate a turning mirror for optical devices according to the present invention will become more clear from the following detailed description thereof, given with reference to the accompanying drawings, where:

FIG. 1 is a simplified schematic representation of a lateral sectioned view of a turning mirror realized according to the teaching of the present invention;

FIGS. 8a-8d are schematic lateral (8a-8c) and top (8d) views of additional steps of the method of the invention for the realization of the mirror of FIG. 1;

FIG. 11 is a schematic view of an electron beam machine setting according to the method of the invention;

PREFERRED EMBODIMENTS OF THE INVENTION

Figure 2A:
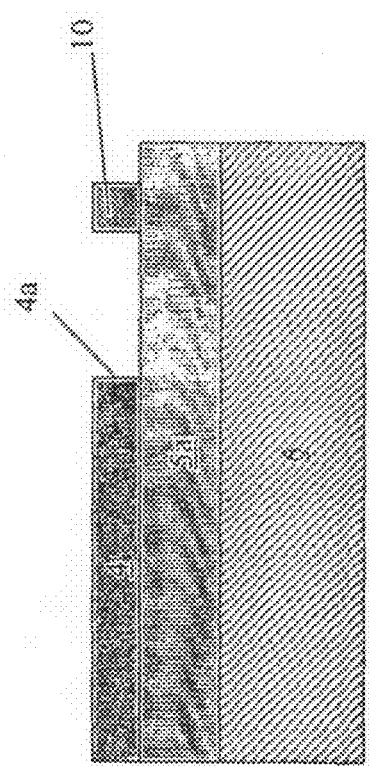
FIGS. 2a-2d are schematic lateral views of different steps for the realization of a portion of an optical device prior to the fabrication of the mirror of FIG. 1.
Figure 2B:
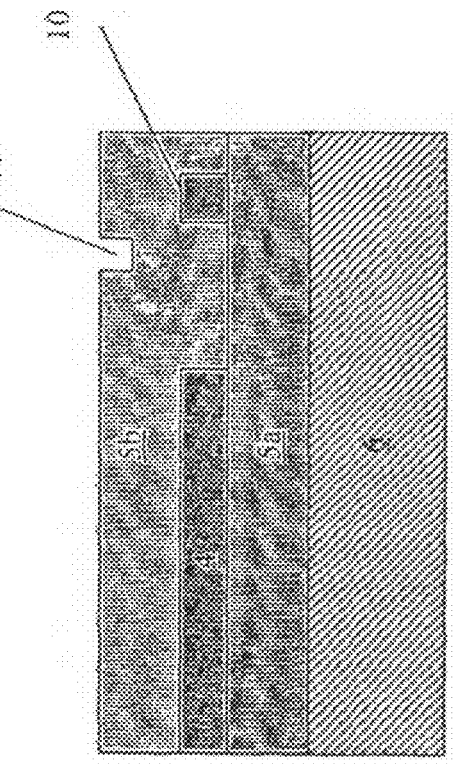

With initial reference to FIG. 1, a portion of an optical device, in particular—but not limited to—an optoelectronic integrated circuit, globally indicated with 100, is shown.

It is to be noted that in the following drawings (not photos) are not to scale, to reveal more clearly certain features of the invention.

The device 100 preferably comprises at least an optical waveguide 2 having a distal end 2a suitable to transport an optical signal OS and connected to at least an input/output device 3, that is for example an optoelectronic transmitter or receiver such as a laser diode or a photodetector. The direction of the propagating signal OS into the waveguide 2 is indicated in FIG. 1 with a dotted line along an X axis.

Additionally, the device 100 comprises a cavity 50 in which a turning mirror 1 is realized according to the teaching of the present invention. The turning mirror 1 comprises a reflective surface 51 located opposite to the distal end 2a surface of the waveguide 2.

The turning mirror 1 is suitable to deflect optical signals OS exiting from/entering to the waveguide 2, which are reflected onto/from the reflective surface 51 (see FIG. 1). Optical signals are directed toward or emitted from optolelectronic device 3. The path of the optical signal OS is depicted in FIG. 1 as a dotted line which is along the X axis when traveling in the waveguide 2, it is then reflected on the surface 51 of the mirror and it thus follows a new axis Y. In case the optoelectronic device is an emitter, such as a laser diode, optical signals are emitted from the device, impinge the angled surface 51, which deflects them and direct them into the waveguide 2. Conversely, if the optoelectronic device 3 is a photodiode, optical signals exit waveguide 2, are deflected by the angled surface 51 and then enter the photodiode.

Even if in the figure the optical signal makes a 90° turn reflecting on the turning mirror 1, any turning angle may be envisaged, depending on the turning mirror's physical characteristics.

In addition, even if in the depicted optical device 100 a waveguide 2 is included, any other device 100 including or not including a waveguide may be considered, the turning mirror realized by the method of the invention being suitable to redirect optical signals coming from any source.

The optical waveguide 2 is realized on a first substrate 6, preferably a silicon based substrate, such as Si, $SiO_2$, doped-$SiO_2$, SiON and the like. Other conventional substrates will become apparent to those skilled in the art given the present description. The waveguide 2 comprises a core 4 and a cladding 5 and it may have any form or dimensions. In particular, the core 4 has a higher refractive index with respect to the cladding 5. Preferably, the waveguide 2 is realized in semiconductor-based materials such as doped or non-doped silicon based materials and other conventional materials used for planar waveguides. Preferably, the core 4 of the waveguide 2 may comprise a doped or un-doped silicon based material, such as Si, $SiO_2$, doped-$SiO_2$, SiON, and the like.

Figure 2C:
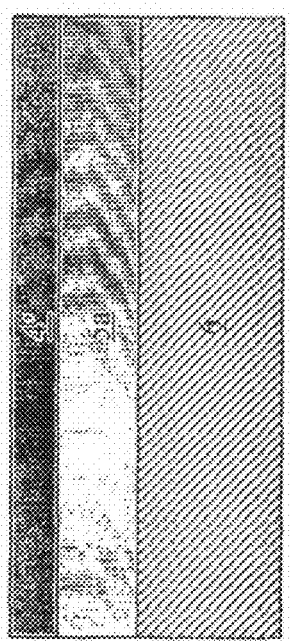
Figure 2D:
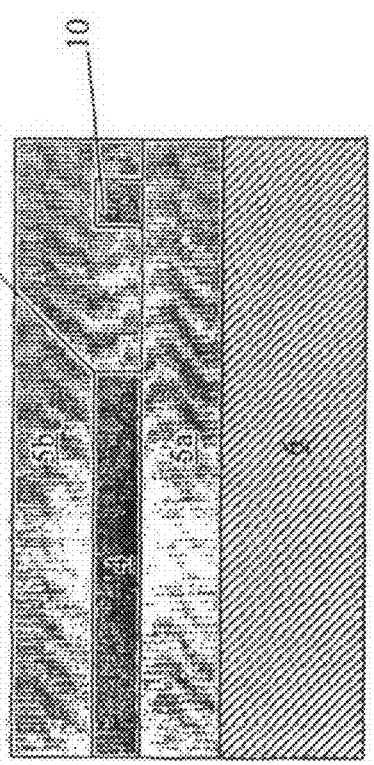

In FIGS. 2a-2d, a preferred embodiment of possible process steps for the realization of the waveguide 2, obtained before the turning mirror 1 fabrication, is shown. A lower cladding layer 5a is firstly formed on the first substrate 6. The thickness of this layer 5a is preferably comprised between 8 µm and 12 µm. Suitable deposition techniques of the lower cladding 5a are for example thermal treatment or, alternatively, Chemical Vapour Deposition (CVD). Then a core layer 4' is grown, for example by CVD, on top of the lower cladding 5a (see FIG. 2a in which the configuration at the end of this step is shown). The core layer 4' is then patterned by means of optical lithography (using a suitable photomask and a UV sensitive photoresist) and Reactive Ion Etching (RIE), to form the core 4 of the waveguide 2. A distal end 4a of the core is formed. During this etching step, preferably also particular structures having a determined geometry are etched on the core layer 4' to act as alignment marks 10 in the following fabrication steps (alignment marks can be seen in FIG. 2b). These alignment marks 10 can be for example located at a given distance from the core distal end 4a on the lower cladding 5a. Afterwards, an additional layer, called upper cladding 5b, is grown, for example by CVD, on top of and around the core 4 (FIG. 2c). The preferred thickness of the core 4 and upper cladding 5b are preferably comprised between 2 µm and 3 µm, and between 8 µm and 12 µm, respectively.

On top of the upper cladding 5b, etched alignment marks 11 are preferably reproduced for the subsequent steps (see FIG. 2d), taking the first marks 10 at the core 4 level as a reference, by means of optical lithography and RIE. These marks 10, 11 have preferably square or cross shapes, typical sizes of tens of microns and typical depths of microns.

However, any other process for the realization of the waveguide 2 can be used instead of the one described above.

Figure 3A:
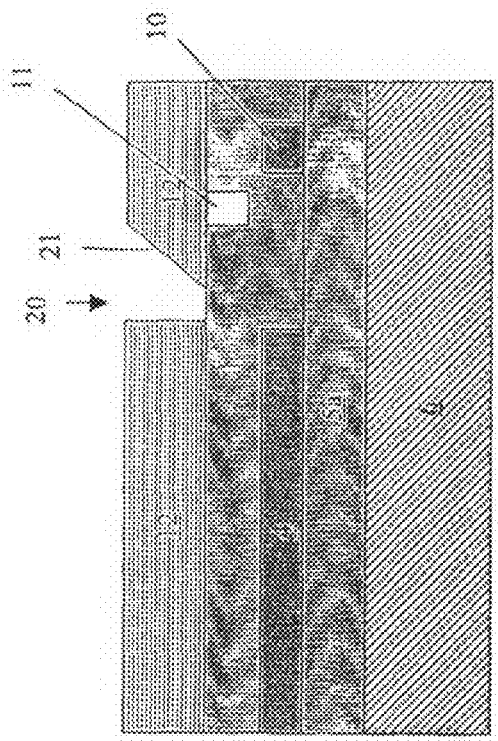
FIGS. 3a-3c are schematic lateral views of different steps of the method of realization of the turning mirror of FIG. 1 according to the invention.
Figure 3B:
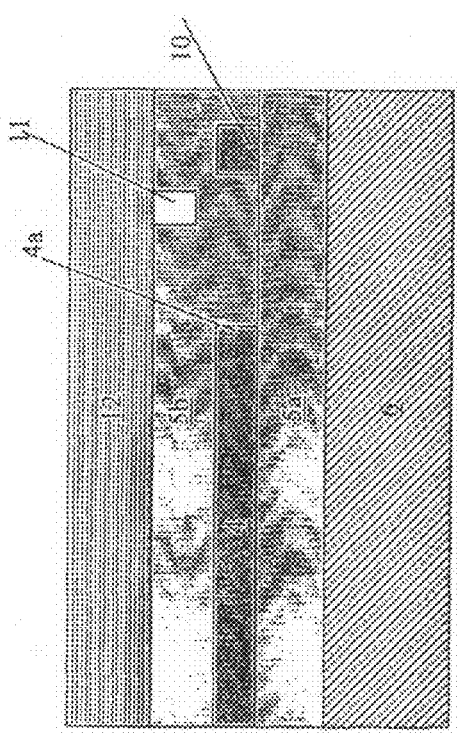
Figure 3C:
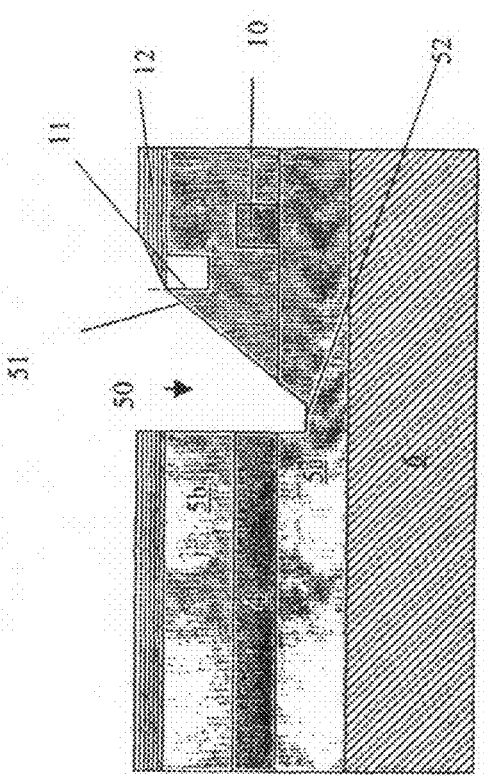

In FIGS. 3a-3c a schematic representation of the mirror fabrication process flow, according to a preferred embodiment of method of the invention, is reported.

A photoresist layer 12 is deposited, preferably for example by spin coating, over the upper cladding 5b of the waveguide 2. The photoresist 12 is selected among the photoresists which are sensitive both to electrons (i.e. to electron beam)

and to optical radiation, in particular ultraviolet (UV) radiation. More specifically, the photoresist 12 is preferably such that it reacts to development, after double exposure, i.e. after both e-beam and UV exposure, as a UV positive, e-beam negative resist.

Preferably, the thickness of the resist 12 deposited over the upper cladding 5b is comprised between 7.5 and 10 µm. Clearly, the selected resist thickness depends on the thickness to be etched afterwards in the waveguide 2 to form the turning mirror. The thickness to be etched in the waveguide 2 is preferably of the order of few tens of microns.

The photoresist 12 is also selected so as to have the desired etching properties. However these properties depend, among others, on the material in which the upper cladding 5b and lower cladding 5a, or more generally the portion of the waveguide 2 to be etched, is formed. In case of a silicon based material, preferably the selectivity with oxide of the photoresist 12 is above 2:1, more preferably comprised between 2:1 and 3:1. The following process steps according to the method of the invention are realized in order the obtain a first taper region structure 20, having a first angled surface 21 with respect to the plane XZ defined by the substrate, in the photoresist 12 to be used as mask for the etching of a turning mirror 1 in the cladding 5.

After resist deposition, a first portion 13 (see FIG. 5) of the resist 12 is patterned using an electron beam. However, multiple portions (not only a single portion) of the photoresist 12 can be modified by e-beam. The electron beam may originate from any conventional e-beam equipment.

A preferred embodiment of the present invention uses SPR® 220 photoresist (hereafter referred to as SPR220) commercialized by Shipley. The response of SPR220 to the electron dose, i.e. the resist thickness remaining after e-beam exposure, UV exposure and development vs. the electron dose provided during e-beam exposure has been measured.

Figure 4:
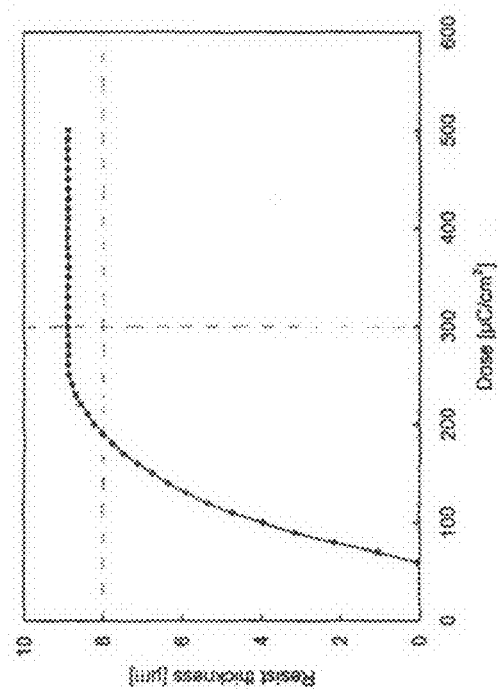
FIG. 4 is a graph showing a contrast curve of the photoresist used in a step of a preferred embodiment of the method of the invention to realize the turning mirror of FIG. 1.

In FIG. 4, a typical SPR220 resist contrast curve is shown for a resist 12 thickness of 9 µm, a substrate of 10 µm thick BPSG on 10 µm thick thermal SiO$_2$ on bulk silicon, a 480 mJ UV exposure energy at a wavelength of 400 nm and a 2 minutes development. Such a resist contrast curve has been used to calculate the correct electron doses to be used for different locations in the pattern in order to obtain the desired resist thickness in that location after UV exposure and development. The same procedure, however, can be used for a different resist, resist thickness, substrate and UV energy.

Figure 5:
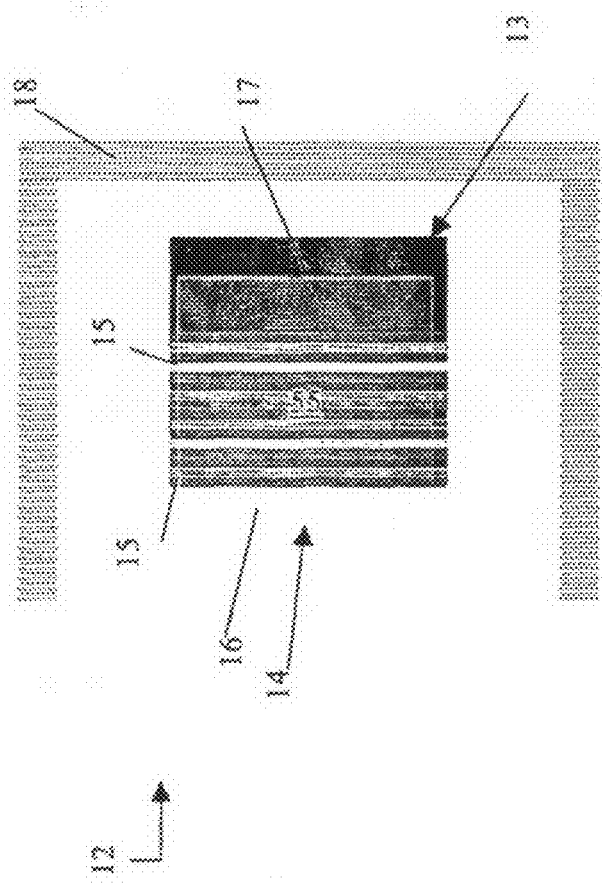
FIG. 5 is a schematic top view of a preferred pattern for the e-beam and UV exposure of the photoresist according to the method of the invention.

Preferably, the photoresist 12 is chosen so as to have a contrast not larger than 3, more preferably not larger or equal to 2, and even more preferably comprised between 1 and 2. The most preferred value is around 1. The contrast of the photoresist is preferably relatively small in order to obtain smooth resist thickness variation to electron dose variation for a wide electron dose interval. In FIG. 5, a preferred pattern for the e-beam exposure of the first portion 13 to obtain a step-like profile in the photoresist 12 after UV exposure and development is shown. The first e-beam exposed portion 13 is represented as the "striped" rectangle in FIG. 5, which is formed by a plurality of smaller rectangular adjacent uniform regions, all indicated with 15. In each region 15 the electron beam dose is substantially uniform (i.e. within the errors and accuracy of the e-beam apparatus), however two adjacent (contiguous) regions 15 are exposed with different e-beam doses. The electron dose in this preferred example varies in a substantially monotonous way from one region 15 to the adjacent region next to it, according to the resist contrast curve shown in FIG. 4. In FIG. 5 only an exemplary pattern is shown, any pattern giving as result the selected heights—after development—for the first tapered region 20 formation can be used.

The portion 13 and regions 15 (depicted schematically in FIG. 5) are located in the photoresist 12 in such a way that, after the etching step of the semiconductor-based material (described in the following), the angled surface 51 of the turning mirror 1 is formed opposite to the distal end 4a of the core 4 of the waveguide 4, so that optical signals OS propagating in the waveguide 2 can be reflected in the surface 51.

In the preferred example of FIG. 5, the regions 15 are in the number of sixteen and have a width of 1 µm each, which means that the multidose scale contains sixteen levels (16 different doses are used), with steps 1 µm wide. However, any number of gray levels could be used. It is noted that decreasing the number of levels below a certain value may produce a rougher mirror surface, whereas increasing the number of levels above a certain value does not improve the surface smoothness of the mirror, while adding complexity to the process. Each colour in the figure represents a different dose value suitable to yield the desired resist thickness after UV exposure and development.

The larger rectangle 17 at the extreme right of FIG. 5 is preferably realized to give the maximum electron dose and hence the maximum resist thickness (saturation in the contrast curve) in order to obtain an overlap with the region exposed to the UV light in the next step of the method of the invention, so as to avoid alignment errors.

The electron doses associated to the uniform regions 15 are determined by the substrate type (the material forming the cladding 5), the resist 12 type and thickness before exposure, the exposure conditions and the development parameters, therefore, depending on the mentioned components, the doses could change.

Having set the initial parameters of the e-beam apparatus, such as the field size and the beam step size, the only parameter to change during patterning is the exposure electron dose, depending on the final desired resist thickness, according to the resist contrast curve. The electron dose is related to the exposure current and to the exposure grid by the following relationship:

$$\text{Dose} = \frac{\text{Current}}{\text{Frequency} \cdot (\text{ExposureGrid})^2} \quad (1)$$

The Exposure Grid, or Beam Step Size (BSS), is equal to the minimum addressable unit multiplied by a pure number called Variable Resolution Unit (VRU). The minimum addressable unit is equal to the field size of the electron beam (area covered by the maximum beam deflection) divided by the number of bits allowed by the e-beam machine hardware and software.

Figure 10:
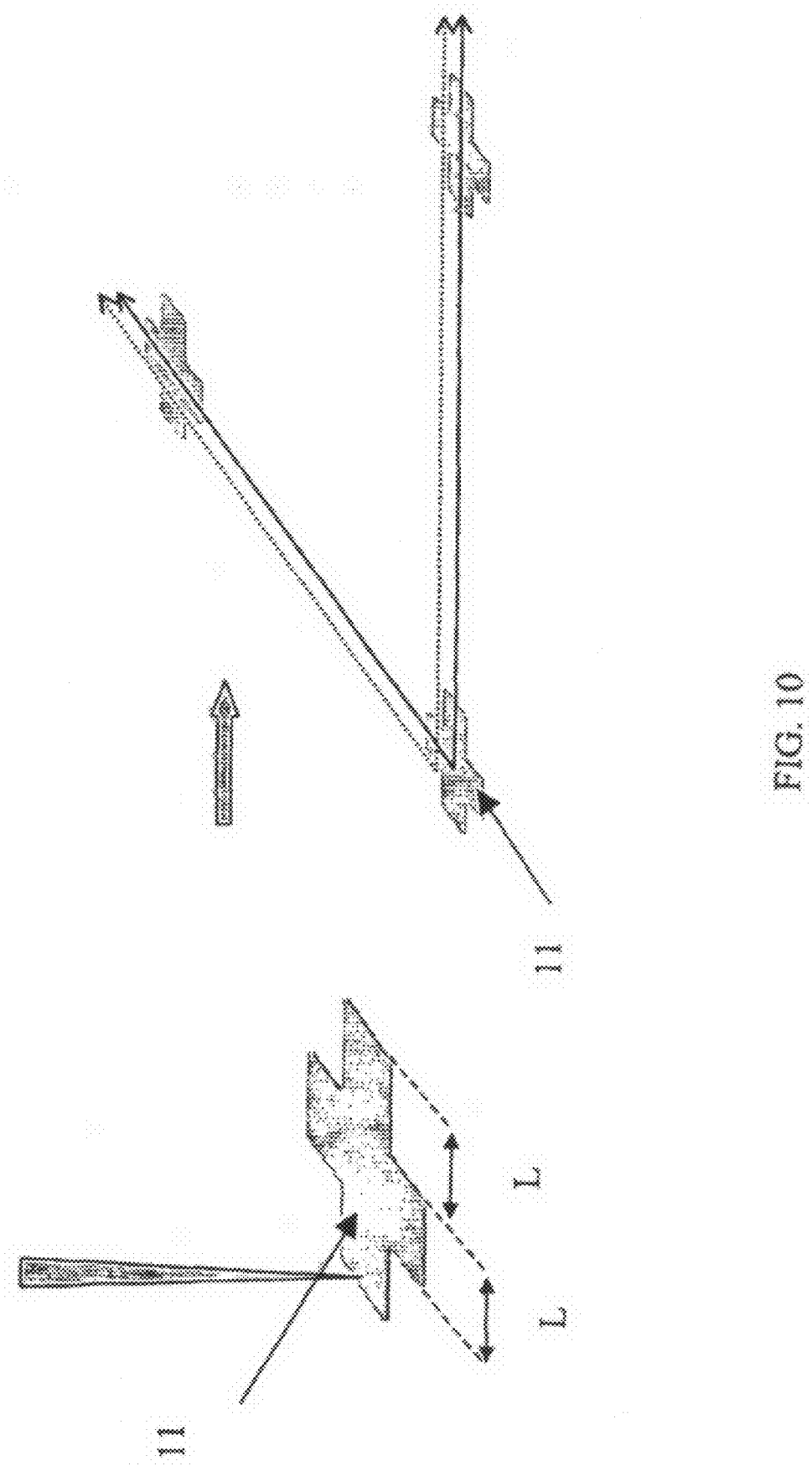
FIG. 10 is a schematic view of an e-beam alignment step of the method of the invention.

The multidose e-beam lithography is preferably performed by means of a gaussian electron beam lithography machine. The alignment marks 11 previously described, etched on top of the upper cladding 5b, are used in an alignment procedure, which includes an electron beam scanning of the marker edges, which is preferably performed in order to accurately locate at least three marks 11 on the wafer, and a change of the exposure frame of reference which has to match the underlying patterned substrate frame of reference. Electron beam scanning of the marker edges, which is needed to accurately locate at least three markers on the wafer, and the change of the exposure frame of reference (dotted arrows) which has to match the underlying patterned substrate frame of reference (thick arrows) are schematically depicted in FIG. 10.

Subsequently to the e-beam exposure, an UV exposure of a second portion 14 (shown in FIG. 5 as a grey rectangle partially overlapping the first striped rectangle 13) of the photoresist 12 follows. The first and the second portions 13, 14 are selected so as to overlap in a third portion 55. The multiple-dose wedge-like structure and the UV exposure region are patterned in different phases, but they are reported together in FIG. 5 just for reference purposes.

An exposure gap 16 (depicted at the extreme left of FIG. 5), which is a region exposed to the UV light but not to the e-beam, is preferably made to give a null electron dose which results in a complete stripping of the resist after UV exposure and development: this is preferred because it leave a flat region 52 between the angled surface 51 and the core distal end 4a surface of the waveguide 2 which will be formed afterwards (see FIG. 3c), in order to eliminate back-reflections of non-paraxial rays into the core 4 of the waveguide 2.

The electron doses (see FIG. 5) increase from the exposure gap 16 towards the large maximum dose region 17 (in dark gray) on the right side of the drawing in FIG. 5. The length of the varying-dose region is chosen in such a way to obtain the correct angle of the angled surface 21 in the resist 12 which gives the target angle in the cladding 5 which will be etched afterwards, at a fixed selectivity between resist 12 and cladding 5.

Figure 12:
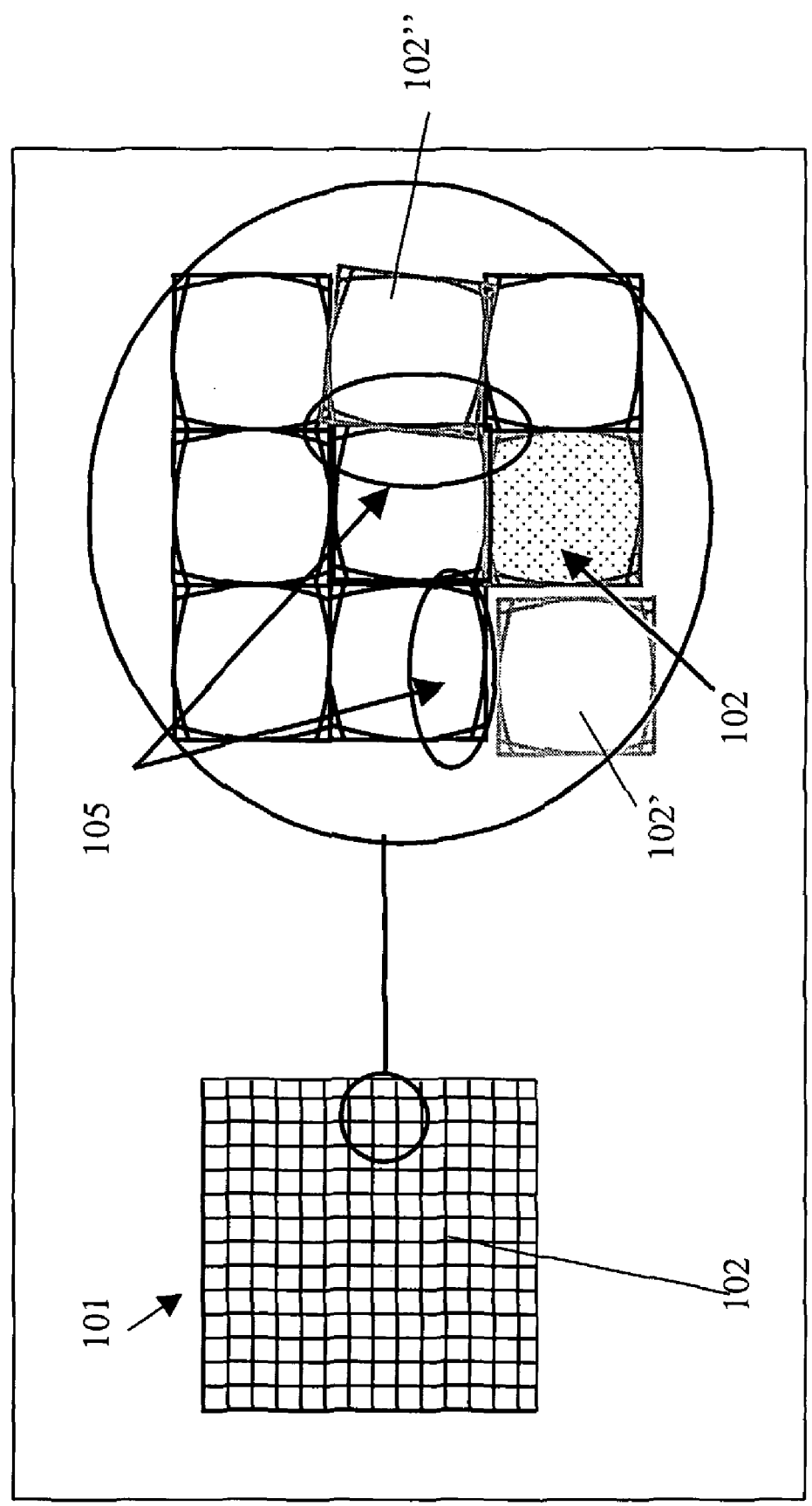
FIG. 12 is a schematic example of an exposure field of a step of the method of the invention.

According to a preferred embodiment of the present invention, the e-beam multidose exposure of the first portion 13 of the photoresist 12 is realized in a multiple exposure manner. In particular, the exposure field of the used electron beam equipment has been divided in a plurality of sub-fields, as generally done in the art of electron beam lithography. However, aberrations and/or stitching of the exposure sub-fields result in a dose variation at the sub-field edges, and hence in undesired extra-features at sub-µm or µm scale, depending on the considered depth of the photoresist 12. Indeed, the selected photoresist of the present invention is particularly sensitive to dose variations to obtain different resist heights after development and thus these unwanted dose variations lead to the formation of additional extra features. An example of the exposure field, sub fields and possible resulting errors is schematically depicted in FIG. 12, where 101 is the writing field, 102 the sub-fields. A rotation of a sub-field or the misplacement of some of them (see for example sub fields 102' and 102" in FIG. 12) cause these unwanted dose variations (see FIG. 12 where the undesired dose variations are numbered with 105 and are evidenced using an ellipse).

As an example, in a preferred embodiment of the invention, the exposure field is equal to 500 µm and the sub-field size is equal to 8 µm (fields and sub-fields are typically square).

According to a preferred step of the method of the invention, the patterning of FIG. 5 of the first portion 13 is realized through a sequence of e-beam exposures, one after the other. At each exposure, the exposure field is shifted (i.e. a rigid translation of the exposure field is made), so that the sub-field boundaries do not overlap between two different exposures. The shift is indicated with a in the figures (in FIG. 13 a=sub-field size/2). Preferably, a is larger or equal to 2 µm. Indeed, narrower shifts may cause an interaction between the edges of different sub-step exposures and may not be advantageous with respect to a single exposure. In case of n exposures, the selected dose to which each region 15 is exposed at each exposure is equal to (selected total dose)/n.

Figure 13:
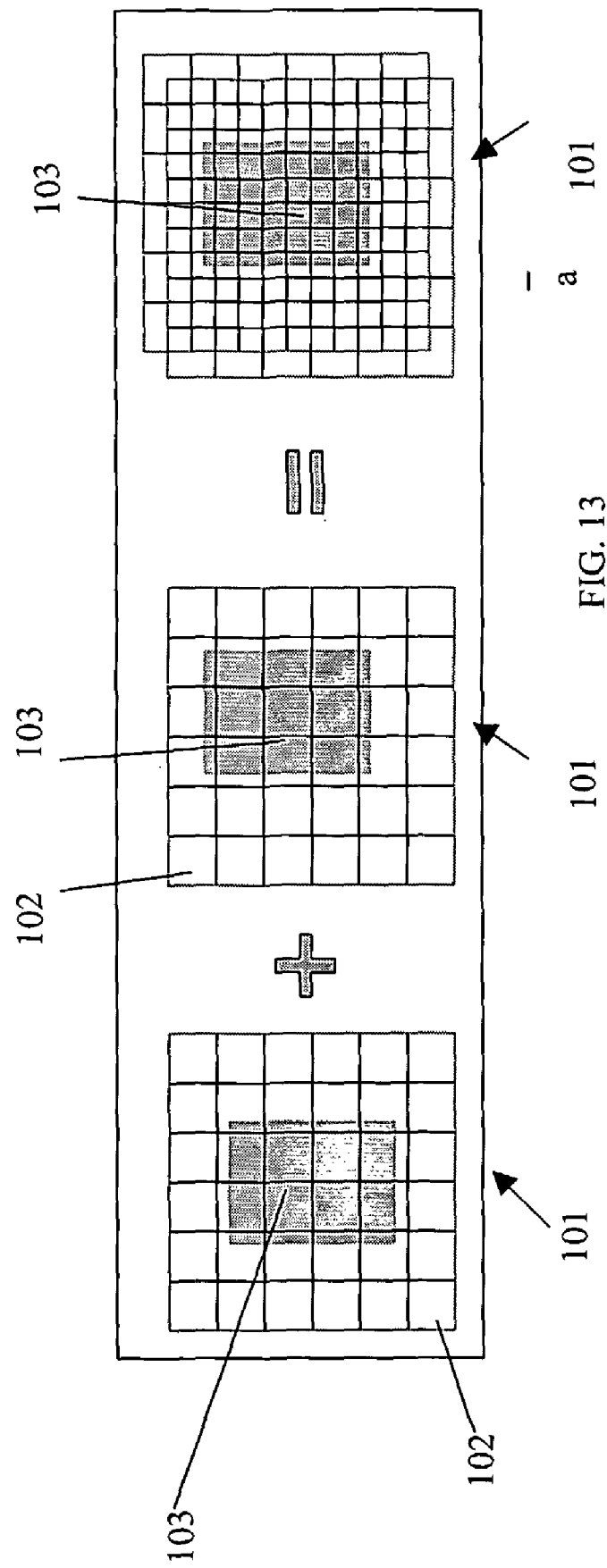
FIG. 13 is a schematic example of an additional step of the method of the invention.

An example of this multiple exposure is given in FIG. 13. The writing field 101 comprising the sub-fields 102 is shifted from the first exposure to the second exposure. The gray rectangle 103 represents the portion to be patterned. In this preferred embodiment, the preferred number of exposures is equal to n=2.

However the preferred number of exposure depends on the shift and on the sub-fields dimension.

After the UV exposure of the second portion 14, the photoresist 12 behaves as a negative resist in the regions previously exposed to the e-beam (in the regions exposed both to e-beam and to UV), and as a positive resist in the other regions (exposed only to UV and not to e-beam).

The subsequent step of the method of the invention is thus the development of the photoresist 12. After development, the desired inclined surface 21 in the third portion 15 of the photoresist 12 where both exposures are performed (i.e. the zone where the light gray square 14 is overlapped to the colored rectangles in FIG. 5 forming the first portion 13) is formed, and at the same time the photoresist 12 complete removal in the exposure gap 16 (i.e. the zone where the light gray square is not overlapped to the colored rectangles in FIG. 5) is obtained (see FIG. 3b and FIG. 6).

Preferably, the photoresist 12 is completely removed also in an additional portion 18, indicated with an external light gray frame in FIG. 5, which is preferably realized to etch in the subsequent steps an optically insulating trench 19 (see FIG. 7) all around the angled surface 51, in order to avoid reflections of spurious signals into the waveguide 2.

In the regions where the first portion 13 (e-beam exposure, colored rectangle of FIG. 5) is not covered by the second portion 14 (the light gray square of the UV exposure in FIG. 5), the photoresist 12 remains unmodified, and hence the cladding 5 is masked during the subsequent etching process.

Figure 6:
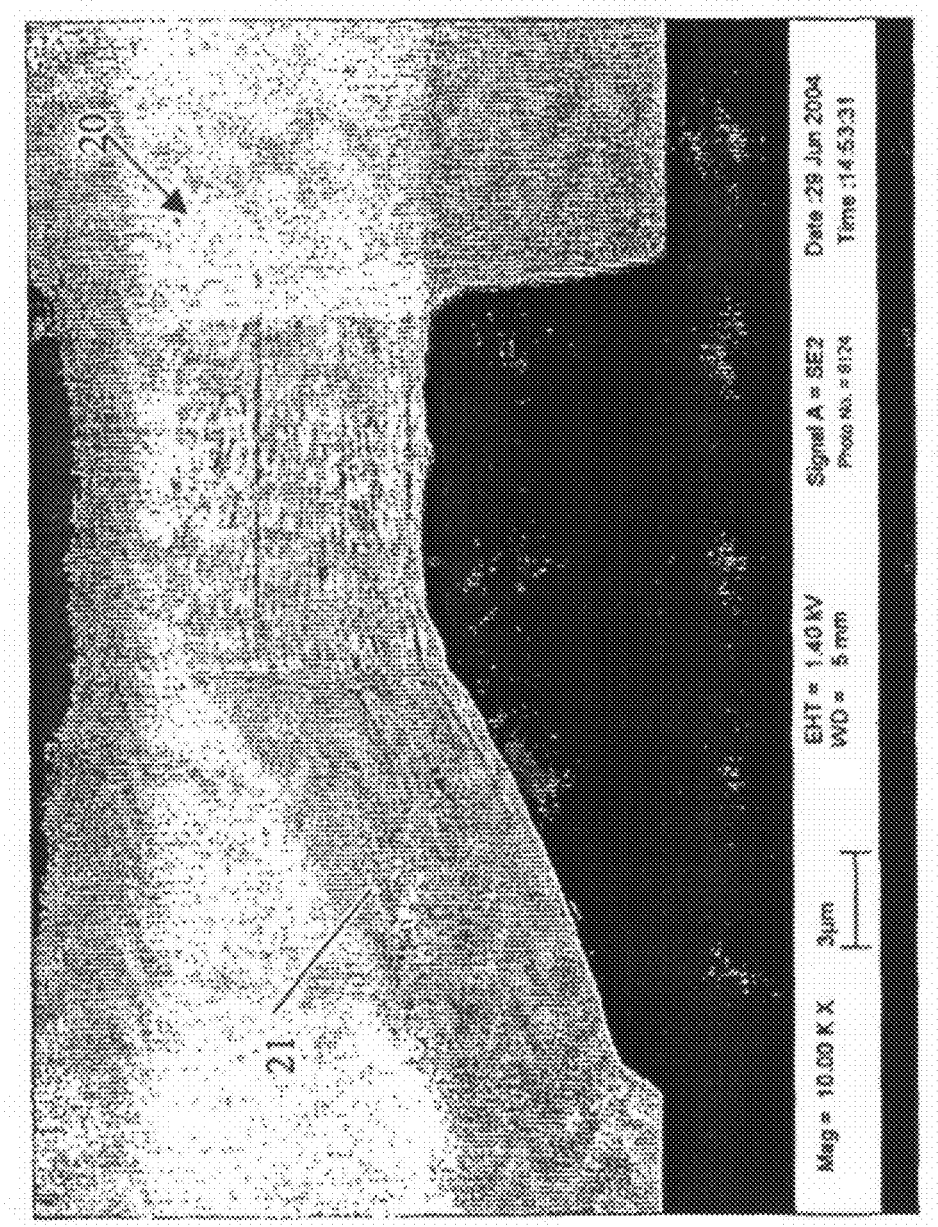
FIG. 6 is a SEM micrograph of an additional step of the method of the invention.

In FIG. 6 a cross section Scanning Electron Microscope (SEM) micrograph of an SPR220 resist profile obtained using the process described (except for the fact that the UV exposure was performed over the whole wafer, without any mask) is shown.

Figure 14A:
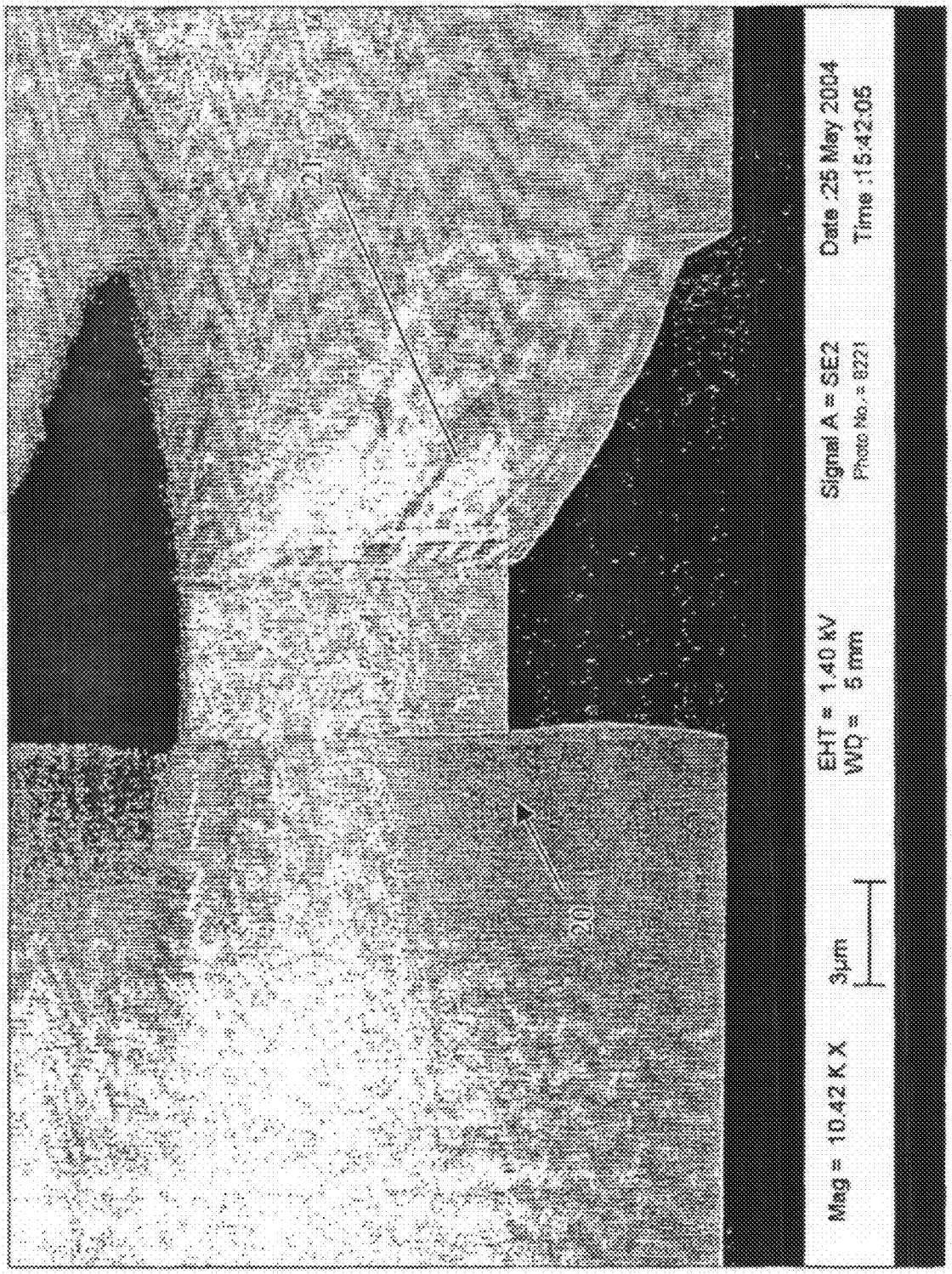
FIGS. 14a and 14b represent two SEM micrographs of a tapered region realized during the method of the invention, with and without an additional step of the method of the invention.
Figure 14B:
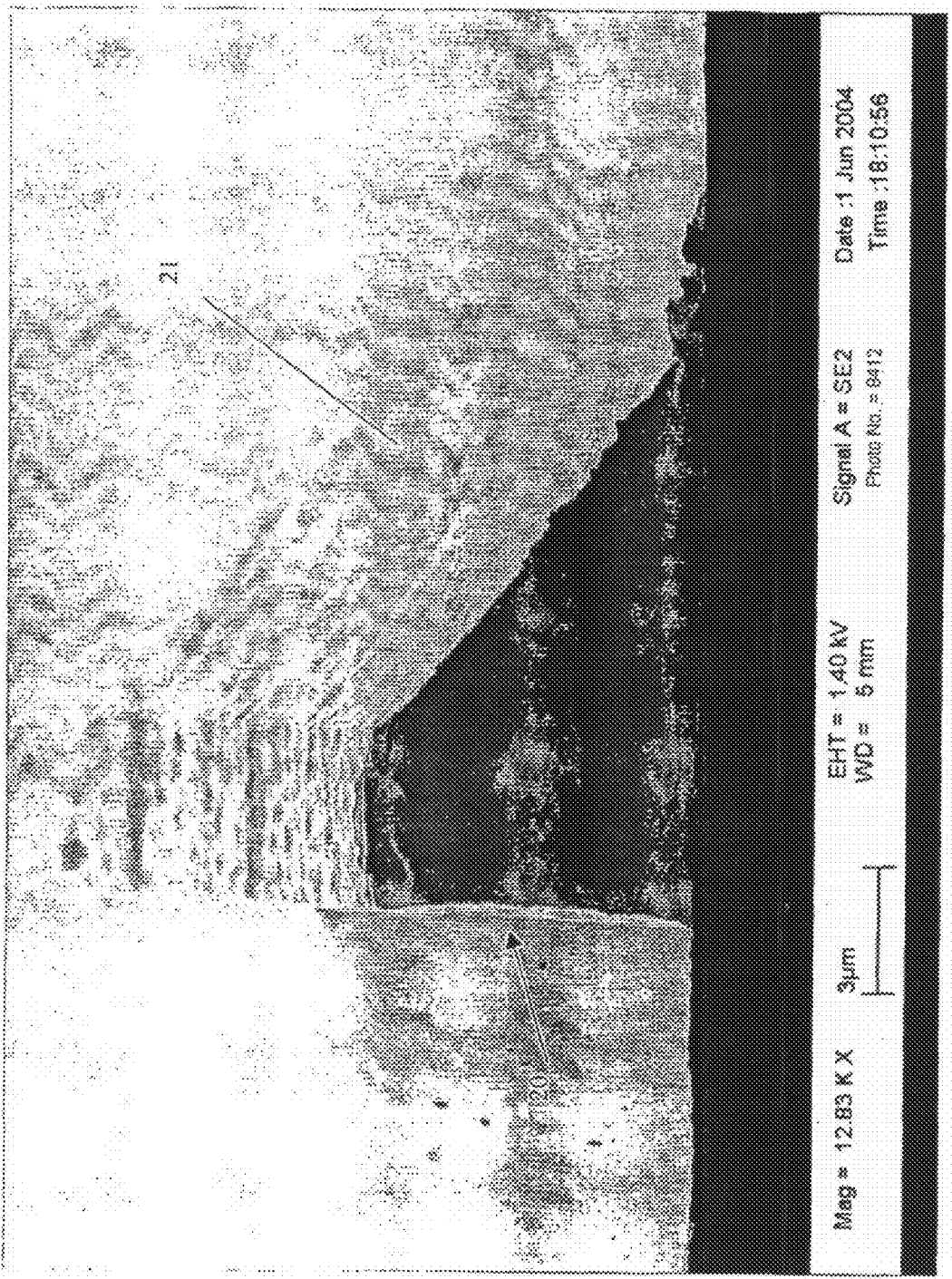

Using FIGS. 14a and 14b, a comparison can be made of two tapered regions 20 made using the same process outlined above, FIG. 14a represents the tapered region obtained using the method without the preferred step of the multiple e-beam exposure, FIG. 14b represents the result with the multiple exposure, where the sub-field size was 8 µm and the shift was 4 µm. In FIG. 14b, the surface 21 presents a reduced roughness with respect to the surface 21 of FIG. 14a.

After the first angled surface 21 has been defined in the photoresist 12, an etching step is carried out into the cladding 5 of the waveguide 2. Preferably, the etching step is performed using a Reactive Ion Etching (RIE). In other words, a plasma is generated applying an RF electric field to the platen, where the wafer is placed on.

In a preferred embodiment, a dry etching phase is performed into the upper cladding 5b and lower cladding 5a, to obtain the desired angled surface 51 (FIG. 3c). Preferably, both the upper cladding 5b and at least part of the lower cladding 5a are etched. During the etching, the patterned photoresist layer 12 acts as a mask for the underlying cladding 5.

During this phase, it is also important to achieve a high anisotropy. The photoresist tapered shape 20 otherwise would not be correctly transferred into the cladding 5.

Typical ranges of the main geometrical parameters of the inclined surface 21 realized in the photoresist 12 and of the final angled surface 51 in the cladding 5 realized after the etching phase, are summarized in the following table 1:

TABLE 1

| Photoresist 12 thickness (μm) | Length of the varying dose region (μm) | Angle formed in the photoresist 12 (degrees) | Angle in the silicon dioxide 5 (degrees) | Etching selectivity |
|---|---|---|---|---|
| 7.5 ÷ 10 | 10 ÷ 20 | 20 ÷ 30 | 40 ÷ 60 | 2:1 ÷ 3:1 |

The varying dose region mentioned in table 1 is the region corresponding to the angled surface.

In the process to obtain the correct angle for the angled surface 51, also the right selectivity between the photoresist 12 and the cladding 5 is selected.

The configuration after this etching step is depicted in FIG. 3c.

With the method of the present invention, it is possible to obtain angles of the inclined plane forming the mirror surface in a wide range of values, between a few degrees and 90°, even if obviously a narrower range is generally preferable, i.e. the preferred range is comprised between 20 and 30 degrees when the first tapered region 20 is considered, whilst the preferred range of the mirror surface 51 angle with respect to the XZ plane is comprised between 40° and 60°. In order to obtain this, it is sufficient to act on the etching selectivity and on the length of the varying dose region.

Preferably, the accuracy achieved is such that the error that can be made on the angle of the reflecting surface 51 is below ±2.5°.

Figure 7:
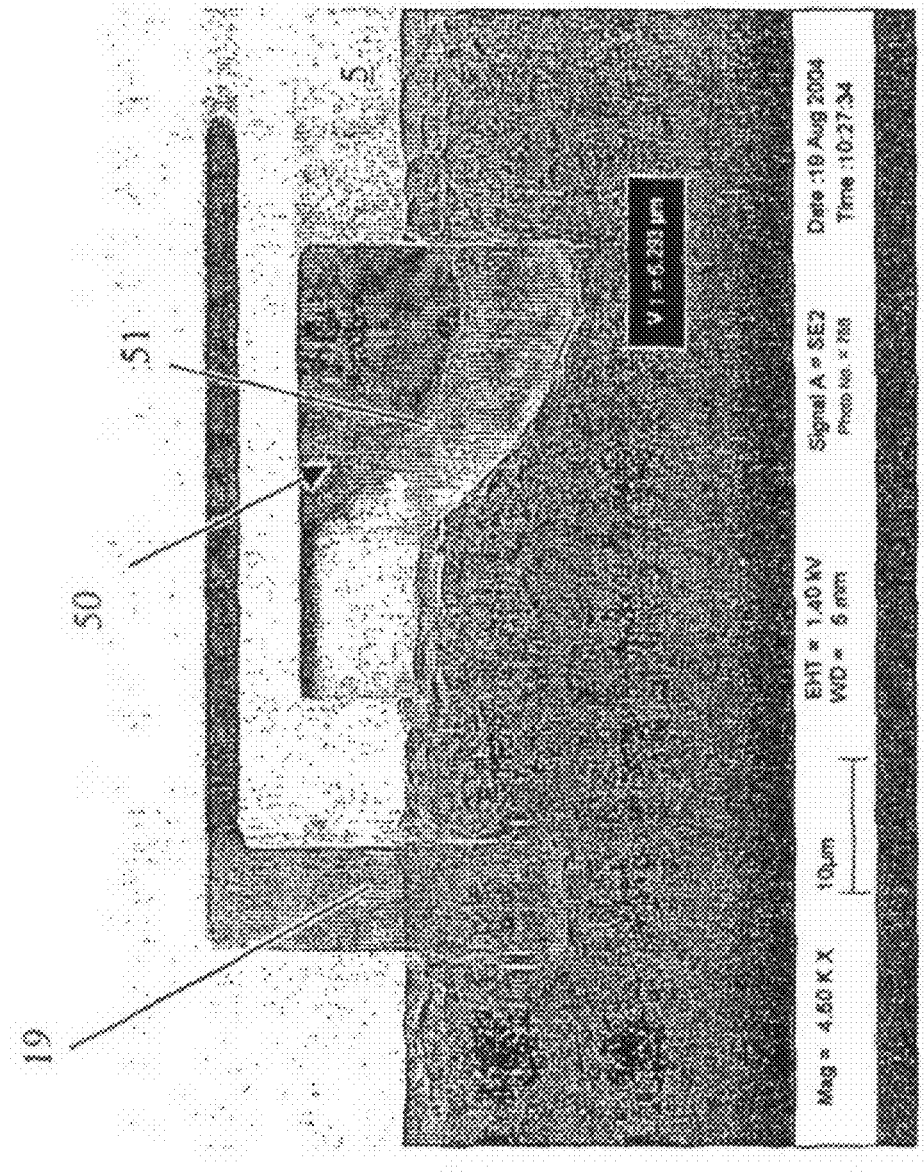
FIG. 7 is a SEM micrograph of an additional step of the method of the invention.
Figure 15:
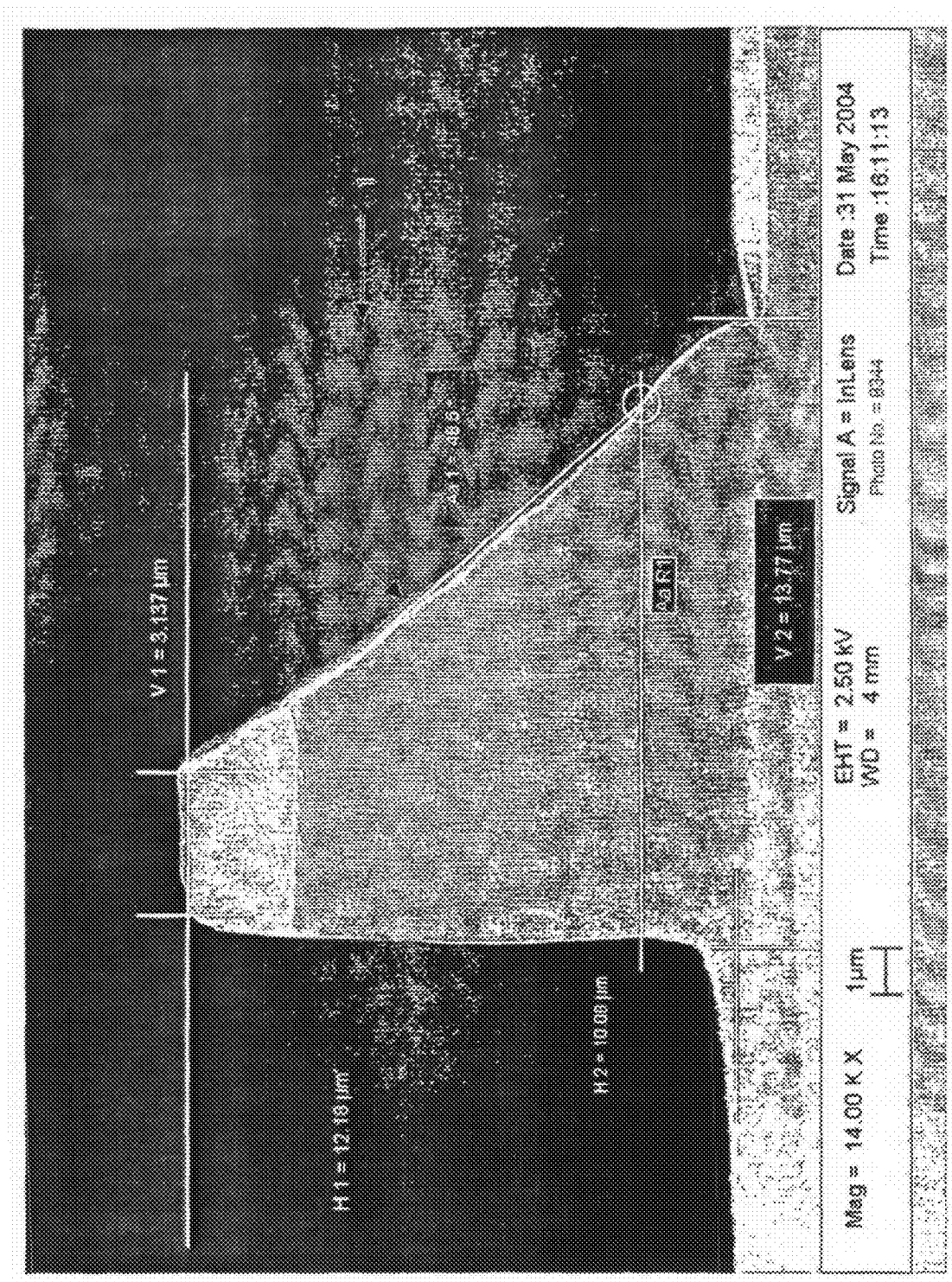
FIG. 15 is a SEM micrograph of the turning mirror obtained with the method of the invention.

A Scanning Electron Microscope (SEM) micrograph of the so formed turning mirror and of the residual resist profile, obtained using the etch process described, is shown in FIG. 7. Here the mirror was cut with a dicer along a direction parallel to the optical axis. In FIG. 15 an additional SEM photograph of the reflective surface 51 is presented, where the high control on verticality and reduced roughness is shown.

EXAMPLE 1

The turning mirror 1 of FIG. 7 is obtained according to the following example.

A 10 μm thick silicon dioxide ($SiO_2$) layer (the lower cladding 5a) is firstly formed by thermal treatment on a silicon substrate, with a refractive index of 1.4585 at 633 nm, to act as the lower cladding. Alternatively, a poorly phosphorus-doped SiO2 layer (PTEOS) can be deposited by Chemical Vapour Deposition (CVD). Then a 2÷3 μm thick Ge-doped SiO2 layer 4' is grown by CVD on top of the lower cladding, with a refractive index of 1.4949÷1.5241 at 633 nm (2.5%÷4.5% index contrast), to act as the waveguide core 4. The core layer 4' is then patterned by means of optical lithography (using a suitable photomask and a UV sensitive photoresist) and Reactive Ion Etching (RIE). During this step, alignment marks 10 are formed. Afterwards, a 8÷10 μm thick boron and phosphorus doped silicon dioxide (BPSG or BPTEOS) layer is grown by CVD on top of and around the core layer, with a refractive index of 1.4585 at 633 nm (upper cladding 5b). On top of the upper cladding 5b, etched alignment marks 11 are reproduced for the subsequent steps, taking the first marks 10 at the core level as a reference, by means of optical lithography and RIE.

The alignment marks 11 are crosses having a dimension L (see FIG. 10)=30 μm.

A SPR220 resist layer 12 having a thickness of 9 μm is deposited on the boron and phosphorus doped silicon dioxide layer 5b, the contrast curve of this resist is shown in FIG. 4. The contrast of this resist 12 is equal to about 1.8. The multidose scale used to pattern the resist 12 contains sixteen different-dose levels (see FIG. 5, the rectangles 15), with steps 1 μm wide.

The constant electron beam lithography machine settings were the following:

| Accelerating voltage | 100 kV | |
|---|---|---|
| Field size | 0.52488 mm | (⇒resolution 2 nm) |
| Beam current | 5 nA | |
| VRU | 16 | (⇒beam step-size, or exposure grid: 32 nm) |

The electron dose was varied from one uniform region 15 to the adjacent one according to eq. (1) by varying the electron beam scanning frequency.

The effect of setting the VRU=4 is shown in FIG. 11. The squared array 60 represents the individual pattern generator grid (or resolution). The black discs 61 represent the exposure grid points or beam-step size.

After the multidose-beam lithography, the resist 12 was exposed to a 480 mJ UV energy at a wavelength of 400 nm by means of a mask-aligner machine, and then developed for 2 minutes in a standard developer.

The resulting configuration after this step is shown in FIG. 6. In the etching phase, the doped $SiO_2$ layer 5b is completely etched and subsequently 6 μm of the thermal $SiO_2$ layer 5a are etched. At the end, the total etched thickness is 14÷16 μm.

The RIE etch step has been carried out on a Trikon Omega MORI etching apparatus. The platen was cooled at 10° C. to keep the wafer temperature constant during the plasma process. The gas used was a $CHF_3/O_2$ mixture and the chamber pressure was kept at 30 mTorr. The total process time necessary to obtain the target etching depth was 1 hour and 20 minutes, and it was divided into 5 steps of 20 minutes each. This division is preferable to be sure not to burn the photoresist during the etch process. The photoresist 12, in fact, is an organic compound that under a continued long time plasma exposure could be irreparably damaged.

A Scanning Electron Microscope (SEM) micrograph of an oxide+SPR220 residual resist profile, obtained using the etch process described, is shown in FIG. 15.

Preferably, as the last process steps, a reflective metallic layer 31 over the angled surface 51 in the cladding 5 is realized, in order to improve the reflectivity of the surface 51. Additionally, preferably also metallic interconnects 32 and metallic pads 35 for the optoelectronic device 3, such as a PIN receiver (not shown in FIGS. 8c and 8d not to hide the underlying structure) are formed.

These process steps are sketched in FIGS. 8a-8d.

A negative resist 33 is used to define the geometry of the mirror reflective layer 31 and of the interconnects 32. The negative resist 33 is deposited over the upper cladding 5b and it is then exposed and developed accordingly (see FIG. 8a). The wafer with the exposed resist 33 is then placed in an evaporation chamber where a metallic layer 31' is evaporated over the wafer (see FIG. 8b). A lift-off process is then performed to eliminate the resist 33, defining in this way the metallic geometry of layer 31 and interconnects 32 (see FIG. 8c. FIG. 8d is a top view of the device 100 in the same configuration as in FIG. 8c).

Preferably, the following metallic layers 31' are alternatively used:

A—Titanium-Platinum-Gold: with a thickness of titanium ranging from 50 to 1000 Angstrom, platinum from 100 to 3000 Angstrom, gold from 500 to 5000 Angstrom;

B—Titanium-Palladium-Gold: with a thickness of titanium ranging from 50 to 1000 Angstrom, platinum from 100 to 3000 Angstrom, gold from 500 to 5000 Angstrom;

C—Tantalum-Gold: with a thickness of tantalum ranging from 50 to 1000 Angstrom, gold from 500 to 5000 Angstrom.

After the metallic layer 31 deposition, a solder stop layer 36 is preferably defined on the metallic interconnects 32 and pads 35. A negative resist is used to define the geometry. For example, the wafer with the exposed resist is then placed in an evaporation chamber and a metallic layer of Titanium or Chromium is evaporated over the wafer. A lift-off process is performed to eliminate the resist, defining in this way the metallic geometry. The scope of the solder stop layer 36 is to avoid that the subsequent deposed layer of eutectic solder (solder which is used to bond the optoelectronic device to the metallic pads 35) can flow over the metallization, allowing in this way a solder bump over the metallic pads 35, enabling the die attach process of the optoelectronic device 3 over the turning mirror structure 1. The thickness of the evaporated material can range from 50 to 1000 Angstrom.

Figure 9B:
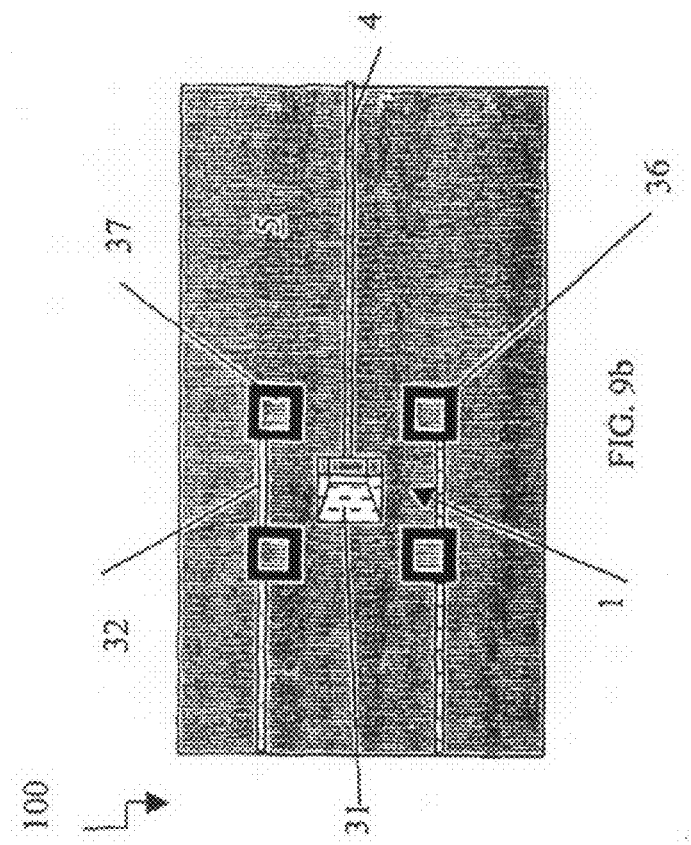
FIGS. 9a-9b are schematic top views of additional steps of the method of the invention for the realization of the mirror of FIG. 1.
Figure 9A:
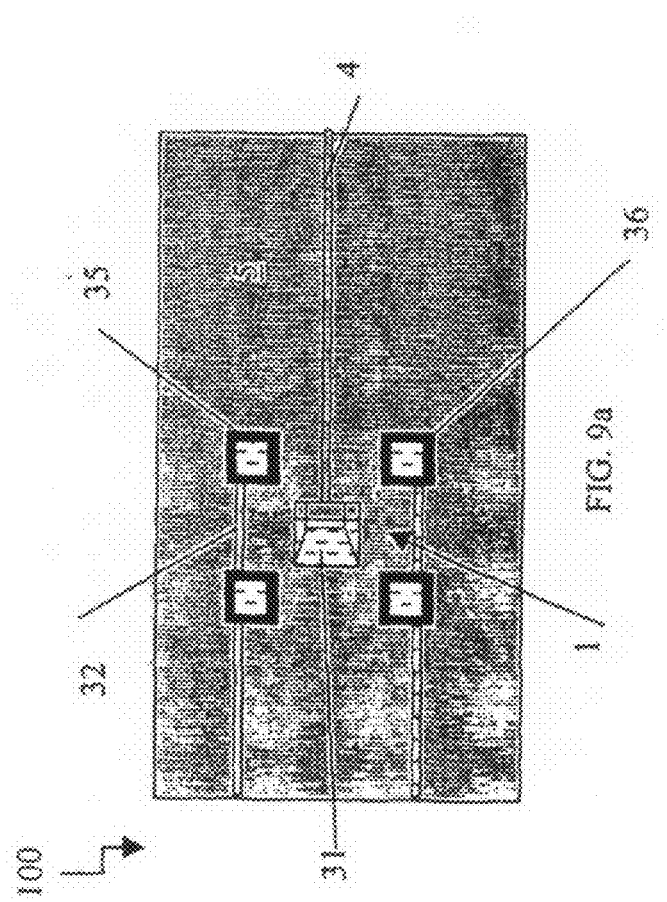

The last process step consists in the realization of the eutectic solder deposition. A negative resist is exposed in order to open the solder pad over the metallic layer. The wafer is placed in an evaporation chamber and a gold-tin solder 37 is evaporated over the wafer. A lift-off process is then performed to eliminate the resist defining in this way a solder pad 37. The thickness of the evaporated solder can range from 3 to 9 micron. In FIGS. 9a and 9b the top side view of the device after the solder stop deposition and after solder deposition is shown.

The invention claimed is:

1. A method of fabricating a turning mirror for an optical device, comprising the steps of:

depositing on a substrate, which defines a plane in which an optical signal propagates in a propagating direction, a photoresist layer sensitive to electrons and to UV radiation, the material in which said photoresist layer is formed having a contrast not larger than 3;

exposing a first portion of said photoresist layer to an electron beam, wherein the electron dose of said electron beam exposure is varied within said first portion according to a selected pattern, and wherein the electron dose to which a given region in the photoresist is exposed depends on the resulting photoresist height in said given region after development;

exposing a second portion of said photoresist layer to UV radiation, said first and said second portion being overlapped at least in a third portion;

developing said photoresist layer so as to form in said third portion of said photoresist layer exposed to both electron beam and to UV radiation a first surface having an angle relative to the propagating direction; and etching said substrate and said photoresist so that a second angled surface is formed in said substrate in correspondence to said third portion, said second surface forming an angle with said propagating direction.

2. The method according to claim 1, wherein the material in which said photoresist layer is formed has a contrast not larger than or equal to 2.

3. The method according to claim 2, wherein the material in which said photoresist layer is formed has a contrast of 1 to 2.

4. The method according to claim 1, wherein the material in which said photoresist layer is formed has a contrast substantially equal to 1.

5. The method according to claim 1, wherein said photoresist has a thickness of 7.5 µm to 10 µm.

6. The method according to claim 1, wherein said photoresist has an etching selectivity with said substrate not smaller than 2:1.

7. The method according to claim 6, wherein said etching selectivity is 2:1 to 3:1.

8. The method according to claim 1, wherein said etching step is a reactive ion etching step.

9. The method according to claim 1, wherein said photoresist is a UV positive, e-beam negative photoresist.

10. The method according to claim 1, wherein said substrate is realized in a silicon based material.

11. The method according to claim 1, comprising the steps of forming a waveguide before the deposition of said photoresist, said waveguide comprising a core and a cladding; and wherein depositing said photoresist on said substrate comprises depositing said photresist on said cladding.

12. The method according to claim 11, wherein said waveguide comprises a distal end and wherein said third portion is located in such a way that, after said etching phase, said second angled surface is formed opposite to said distal end surface of said waveguide, so that an optical signal propagating in said waveguide is reflected on said second angled surface.

13. The method according to claim 11, comprising the step of forming alignment marks on said substrate before said photoresist deposition.

14. The method according to claim 13, wherein said alignment marks are formed during the formation of said core of said waveguide.

15. The method according to claim 1, wherein the angle between said first surface and the propagating direction is 20° to 30°.

16. The method according to claim 1, wherein the angle between said second surface and the propagating direction is 40° to 60°.

17. The method according to claim 1, comprising the step of forming a reflective layer on said second angled surface.

18. The method according to claim 17, wherein said reflective layer is a metallic layer.

19. The method according to claim 1, wherein said first portion comprises a plurality of adjacent regions, each region being exposed to a substantially uniform electron dose.

20. The method according to claim 19, wherein said adjacent regions have a constant width along said propagating direction.

21. The method according to claim 19, wherein the electron dose of said adjacent regions varies in a substantially monotonous way from one adjacent region to the adjacent region next to it.

22. The method according to claim 1, wherein said step of exposing a first portion of said photoresist layer to an electron beam, comprises the sub-steps of:

dividing an exposure field in a plurality of sub-fields having given boundaries;

selecting a number of exposures; and exposing said first portion of said photoresist layer to said electron beam n times, said exposure field being shifted from one exposure to the following one so that said boundaries of said sub-fields do not overlap.

23. The method according to claim 22, comprising the step of selecting the total electron dose to be given to each region of said photoresist, and wherein, at each electron exposure, the electron dose to which a given region in the photoresist is exposed is equal to the total electron dose divided by the number of exposures.

24. The method according to claim 22, wherein said shift between exposure fields is not smaller than 2 μm.

* * * * *